(12) United States Patent
Jobetto

(10) Patent No.: US 7,867,828 B2
(45) Date of Patent: Jan. 11, 2011

(54) METHOD OF FABRICATING A SEMICONDUCTOR DEVICE INCLUDING FORMING AN INSULATING LAYER WITH A HARD SHEET BURIED THEREIN

(75) Inventor: Hiroyasu Jobetto, Hachioji (JP)

(73) Assignees: Casio Computer Co., Ltd., Tokyo (JP); CMK Corporation, Tokyo (JP)

( * ) Notice: Subject to any disclaimer, the term of this patent is extended or adjusted under 35 U.S.C. 154(b) by 449 days.

(21) Appl. No.: 11/782,587

(22) Filed: Jul. 24, 2007

(65) Prior Publication Data

US 2008/0014681 A1    Jan. 17, 2008

Related U.S. Application Data

(62) Division of application No. 11/018,138, filed on Dec. 20, 2004, now Pat. No. 7,489,032.

(30) Foreign Application Priority Data

Dec. 25, 2003  (JP)  ............................. 2003-428695
Mar. 31, 2004  (JP)  ............................. 2004-107798

(51) Int. Cl.
*H01L 21/56* (2006.01)
(52) U.S. Cl. .................. 438/126; 438/106; 257/700
(58) Field of Classification Search .................. 438/126
See application file for complete search history.

(56) References Cited

U.S. PATENT DOCUMENTS

| 5,497,033 | A | 3/1996 | Fillion et al. |
| 6,163,456 | A | 12/2000 | Suzuki et al. |
| 6,271,469 | B1 | 8/2001 | Ma et al. |
| 6,909,054 | B2 | 6/2005 | Sakamoto et al. |
| 2001/0010627 | A1 | 8/2001 | Akagawa |
| 2001/0020736 | A1* | 9/2001 | Nakazawa et al. .......... 257/678 |
| 2002/0066955 | A1 | 6/2002 | Shibamoto et al. |
| 2002/0070443 | A1 | 6/2002 | Mu et al. |
| 2002/0105070 | A1 | 8/2002 | Shibamoto et al. |
| 2002/0108768 | A1 | 8/2002 | Jimarez et al. |
| 2002/0144775 | A1 | 10/2002 | Tung et al. |
| 2003/0168254 | A1 | 9/2003 | Kariya et al. |
| 2003/0230804 | A1* | 12/2003 | Kouno et al. ................ 257/734 |
| 2005/0098891 | A1 | 5/2005 | Wakabayashi et al. |

FOREIGN PATENT DOCUMENTS

EP    0 865 082 A1   9/1998
JP    2003-298005 A   10/2003

* cited by examiner

*Primary Examiner*—Wael M Fahmy
*Assistant Examiner*—Abul Kalam
(74) *Attorney, Agent, or Firm*—Holtz, Holtz, Goodman & Chick, PC

(57) ABSTRACT

A semiconductor device includes a base plate, and a semiconductor constituent body formed on the base plate. The semiconductor constituent body has a semiconductor substrate and a plurality of external connecting electrodes formed on the semiconductor substrate. An insulating layer is formed on the base plate around the semiconductor constituent body. A hard sheet is formed on the insulating layer. An interconnection is connected to the external connecting electrodes of the semiconductor constituent body.

21 Claims, 30 Drawing Sheets

METHOD OF FABRICATING A SEMICONDUCTOR DEVICE INCLUDING FORMING AN INSULATING LAYER WITH A HARD SHEET BURIED THEREIN

CROSS-REFERENCE TO RELATED APPLICATIONS

The present application is a Divisional Application of U.S. application Ser. No. 11/018,138 filed Dec. 20, 2004 now U.S. Pat. No. 7,489,032, which is based upon and claims the benefit of priority from prior Japanese Patent Applications No. 2003-428695, filed Dec. 25, 2003; and No. 2004-107798, filed Mar. 31, 2004, the entire contents of both of which are incorporated herein by reference.

BACKGROUND OF THE INVENTION

1. Field of the Invention

The present invention relates to a semiconductor device and a method of fabricating the same.

2. Description of the Related Art

The conventional semiconductor device disclosed in Jpn. Pat. Appln. KOKAI Publication No. 2003-298005 includes solder balls as connecting terminals outside a semiconductor chip having a predetermined size. Therefore, this semiconductor device has a structure in which the semiconductor chip has a plurality of connecting pads on its upper surface, and is formed on the upper surface of a base plate. An insulating layer is formed on the upper surface of the base plate around the semiconductor chip. An upper insulating film is formed on the upper surfaces of the semiconductor chip and insulating layer, upper interconnections are formed on the upper surface of the upper insulating film so as to be connected to the connecting pads of the semiconductor chip, portions except for connecting pad portions of the upper interconnections are covered with an uppermost insulating film. Solder balls are respectively formed on the connecting pad portions of the upper interconnections.

The above conventional semiconductor device is, for example, fabricated as follows. To increase the productivity, a plurality of semiconductor chips are separately arranged on the upper surface of a base plate having an area capable of forming a plurality of completed semiconductor devices. An insulating layer is formed on the upper surface of the base plate around semiconductor chips. An upper insulating film is formed on the upper surfaces of the semiconductor chips and insulating layer. Upper interconnections are formed on the upper surface of the upper insulating film so as to be electrically connected to connecting pads of the semiconductor chips. Portions except for connecting pad portions of the upper interconnections are covered with an uppermost insulating film. Solder balls are formed on the connecting pad portions of the upper interconnections. The base plate, insulating layer, upper insulating film, and uppermost insulating film are cut between the semiconductor chips, thereby obtaining a plurality of conventional semiconductor devices described above.

In this conventional semiconductor device fabrication method, the insulating layer is formed on the upper surface of the base plate around semiconductor chips by thermally hardening and shrinking an insulating layer formation layer made of an unhardened resin such as an epoxy-based resin or polyimide-based resin. Therefore, the base plate largely warps, and this interferes with transfer to the subsequent steps and decreases the processing accuracy in the subsequent steps. For example, when the dimensions of a base plate having an area capable of forming a plurality of completed semiconductor devices are 300 mm×250 mm, the warping amount of the base plate is as large as 13 to 15 mm.

BRIEF SUMMARY OF THE INVENTION

It is, therefore, an object of the present invention to provide a semiconductor device capable of reducing the warping of a base plate, and a method of fabricating the same.

To achieve the above object, a hard sheet is placed on an insulating layer formation layer formed on a base plate and made of a material containing at least a semi-hardened resin or liquid resin, and an insulating layer is formed by fully hardening the semi-hardened resin or liquid resin in the insulating layer formation layer by heating and pressing.

In the present invention, the hard sheet is placed on the insulating layer formation layer formed on the base plate and comprising the semi-hardening resin or liquid resin. In this portion, therefore, the material arrangement in the direction of thickness is substantially symmetrical. Accordingly, when heat and pressure are applied, the insulating layer formation layer hardens and shrinks substantially symmetrically in the thickness direction. As a consequence, the warping of the base plate can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

First Embodiment

Figure 1:
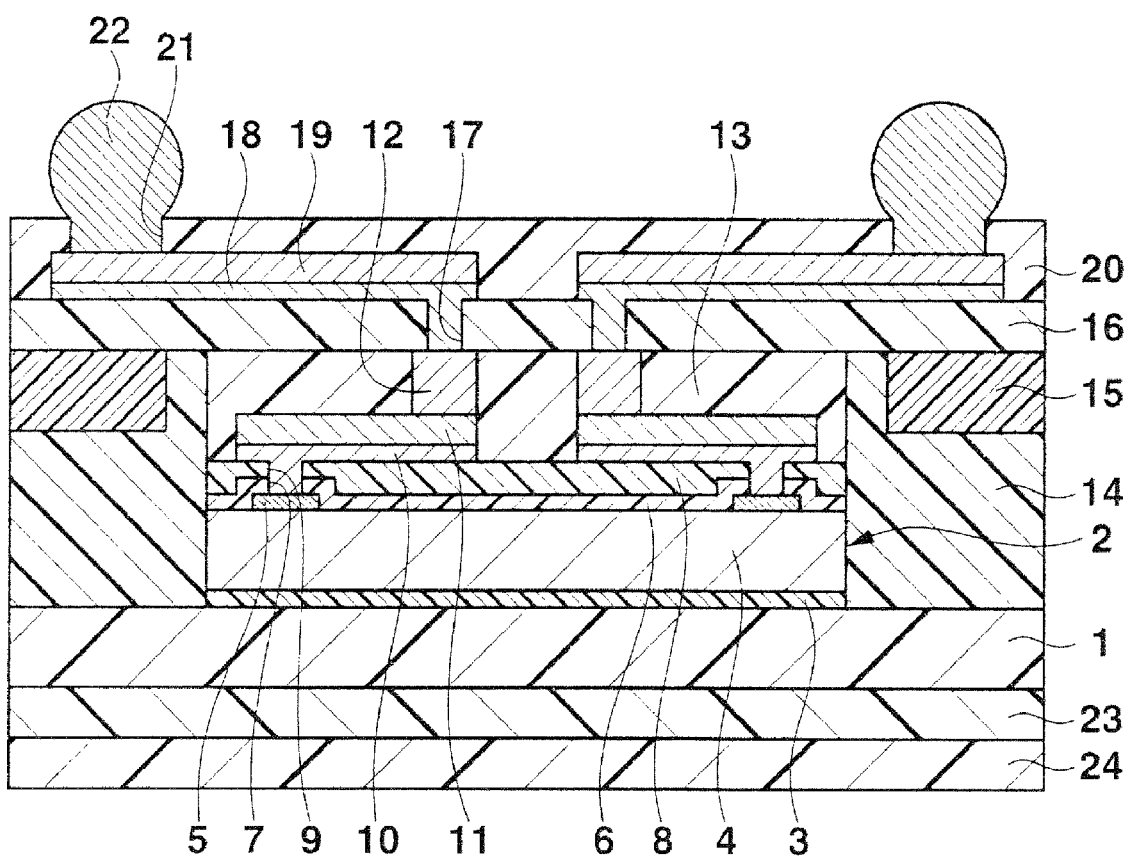
FIG. 1 is a sectional view of a semiconductor device according to the first embodiment of the present invention.

FIG. 1 is a sectional view of a semiconductor device according to the first embodiment of the present invention. This semiconductor device includes a base plate 1 having a square planar shape. The base plate 1 is made of a material which is generally used as a printed circuit board. Examples of this material are a substrate made of an inorganic material such as glass cloth, glass fibers, or aramid fibers and impregnated with a thermosetting resin such as an epoxy-based resin, polyimide-based resin, or BT (Bismaleimide-Triazine) resin, and a thermosetting resin such as an epoxy-based resin.

The lower surface of a semiconductor constituent body 2 having a square planar shape and a size smaller to a certain degree than the size of the base plate 1 is adhered to the upper surface of the base plate 1 via an adhesive layer 3 made of a die bonding material. The semiconductor constituent body 2 has interconnections 11, columnar electrodes 12, and an encapsulating film 13 (all of which will be explained later), and is generally called a CSP (Chip Size Package). Since individual semiconductor constituent bodies 2 are obtained by dicing after the interconnections 11, columnar electrodes 12, and encapsulating film 13 are formed on a silicon wafer as will be described later, the semiconductor constituent body 2 is also particularly called a wafer level CSP (W-CSP). The structure of the semiconductor constituent body 2 will be explained below.

The semiconductor constituent body 2 includes a silicon substrate (semiconductor substrate) 4. The lower surface of the silicon substrate 4 is adhered to the upper surface of the base plate 1 via the adhesive layer 3. An integrated circuit (not shown) having a predetermined function is formed on the upper surface of the silicon substrate 4. A plurality of connecting pads 5 made of metal, e.g., an aluminum-based metal are formed on the upper surface at its periphery so as to be electrically connected to the integrated circuit. An insulating film 6 made of silicon oxide or the like is formed on the upper surface of the silicon substrate 4 and the connection pads 5 except for central portions of the connecting pads 5. These central portions of the connecting pads 5 are exposed through holes 7 formed in the insulating film 6.

A protective film 8 made of an insulating material, e.g., an epoxy-based resin or polyimide-based resin is formed on the upper surface of the insulating film 6. Holes 9 are formed in those portions of the protective film 8, which correspond to the holes 7 in the insulating film 6. Metal undercoatings 10 made of copper or the like are formed on the upper surface of the protective film 8. The copper interconnections 11 are directly formed on the entire upper surface of the metal undercoatings 10. One end portion of the metal undercoating 10 and thus the interconnection 11 is electrically connected to the connecting pad 5 at its are end through the holes 7 and 9.

The columnar electrodes (external connecting electrodes) 12 made of copper are formed on the upper surfaces of connecting pad portions or the other ends of the interconnections 11. The encapsulating film 13 made of an insulating material, e.g., an epoxy-based resin or polyimide-based resin is formed on the upper surfaces of the protective film 8 and interconnections 11, such that the upper surface of the encapsulating film 13 is leveled with the upper surfaces of the columnar electrodes 12. As described above, the semiconductor constituent body 2 called a W-CSP includes the silicon substrate 4, connecting pads 5, and insulating film 6, and also includes the protective film 8, interconnections 11, columnar electrodes 12, and encapsulating film 13.

A square frame-like insulating layer 14 is formed on the upper surface of the base plate 1 around the semiconductor constituent body 2. The insulating layer 14 is usually called a prepreg material which is a substrate comprising an inorganic material such as glass cloth, glass fibers, or aramid fibers and impregnated with a thermosetting resin such as an epoxy-based resin, polyimide-based resin, or BT (Bismaleimide Toriadin) resin. A square frame-like hard sheet 15 is buried in the periphery of the upper surface of the insulating layer 14. The material and thickness of the hard sheet 15 are the same as the base plate 1. The upper surfaces of the insulating layer 14 and hard sheet 15 are substantially leveled with the upper surface of the semiconductor constituent body 2.

On the upper surfaces of the semiconductor constituent body 2, insulating layer 14, and hard sheet 15, an upper insulating film 16 is formed to have a flat upper surface. The upper insulating film 16 is usually called a buildup material for use in a buildup substrate, and formed by dispersing a reinforcing material such as fibers or a filler in a thermosetting resin such as an epoxy-based resin, polyimide-based resin, or BT resin. The fibers are, e.g., glass fibers or aramid fibers. The filler is, e.g., a silica filler or a ceramics-based filler.

Holes 17 are formed in those portions of the upper insulating film 16, which correspond to the central portions of the upper surfaces of the columnar electrodes 12. An upper metal undercoating 18 made of copper or the like is formed on the upper surface of the upper insulating film 16. Upper interconnections 19 made of copper are formed on the entire upper surface of the upper metal undercoating 18. One end portion of including the upper metal undercoating 18 and thus interconnection 19 is electrically connected to the upper surface of the columnar electrode 12 through the hole 17 in the upper insulating film 16.

An uppermost insulating film 20 formed of a solder resist or the like is formed on the upper surface of the upper insulating film 16 and the upper interconnections 19. Through holes 21 are formed in those portions of the uppermost insulating film 20, which correspond to connecting pad portions of the upper interconnections 19. Solder balls 22 are formed in and above the holes 21 so as to be electrically and mechanically connected to the connecting pad portions of the upper interconnections 19. The solder balls 22 are arranged in a matrix on the uppermost insulating film 20, and some or all of the balls are positioned outside the body 2.

A lower insulating film 23 made of the same material as the upper insulating film 16 is formed on the lower surface of the base plate 1. A lowermost insulating film 24 made of the same material as the uppermost insulating film 20 is formed on the lower surface of the lower insulating film 23.

As described above, the size of the base plate 1 is made larger to some extent than the size of the semiconductor constituent body 2, in order to make the size of the formation region of the solder balls 22 larger to a certain degree than that of the semiconductor constituent body 2 in accordance with the increase in number of the connecting pads 5 on the silicon substrate 4. This makes the size and pitch of the connecting pad portions (the portions in the holes 21 of the uppermost insulating film 20) of the upper interconnections 19 larger than those of the columnar electrodes 12.

Accordingly, those connecting pad portions of the upper interconnections 19, which are arranged in a matrix are formed not only in a region corresponding to the semiconductor constituent body 2, but also in a region corresponding to the insulating layer 14 formed outside the side surfaces of the semiconductor constituent body 2. That is, of the solder balls 22 arranged in a matrix, at least outermost solder balls 22 are formed in a periphery positioned outside the semiconductor constituent body 2.

Figure 2:
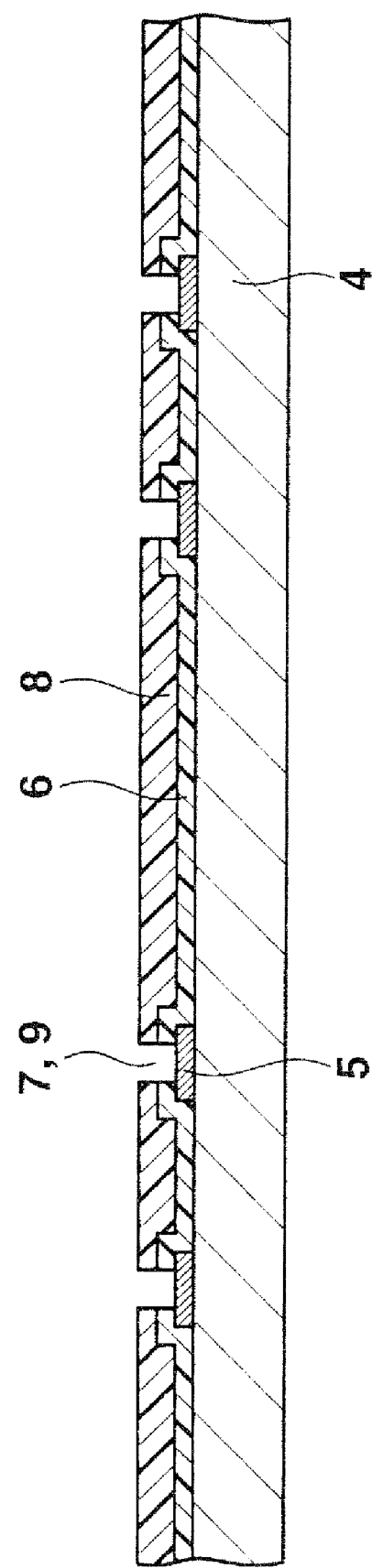
FIG. 2 is a sectional view showing an initially prepared material in an example of a method of fabricating the semiconductor device shown in FIG. 1.

An example of a method of fabricating this semiconductor device will be described below. First, an example of the fabrication method of the semiconductor constituent body 2 will be explained. In this method, an assembly as shown in FIG. 2 is prepared. In this assembly, connecting pads 5 made of, e.g., an aluminum-based metal, an insulating film 6 made of, e.g., silicon oxide, and a protective film 8 made of, e.g., an epoxy-based resin or polyimide-based resin are formed on a wafer-like silicon substrate (semiconductor substrate) 4. Central portions of the connecting pads 5 are exposed through holes 7 and 9 formed in the insulating film 6 and protective film 8. In the wafer-like silicon substrate 4 having this structure, an integrated circuit having a predetermined function is formed in a region where each semiconductor constituent body is to be formed, and each connecting pad 5 is electrically connected to the integrated circuit formed in the corresponding region.

Figure 3:
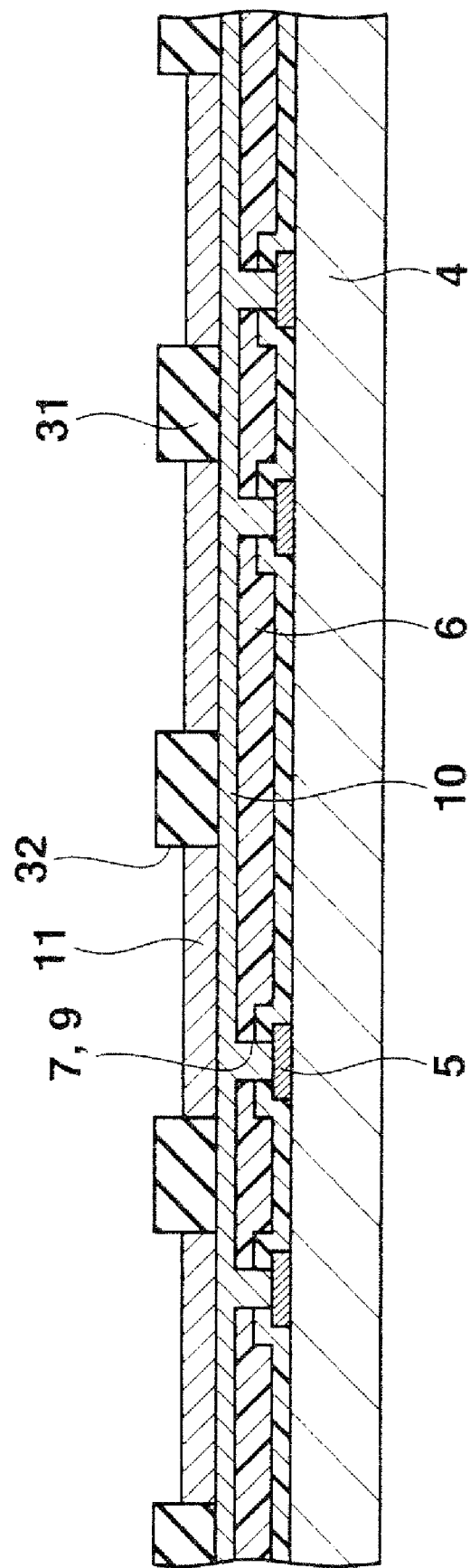
FIG. 3 is a sectional view of an assembly in a step following FIG. 2.

As shown in FIG. 3, a metal undercoating 10 is formed on the entire upper surface of the protective film 8 including the upper surfaces of the connecting pads 5 exposed through the holes 7 and 9. The metal undercoating 10 can be any of a copper layer formed by electroless plating, a copper layer formed by sputtering, and a combination of a thin film of titanium or the like formed by sputtering and a copper layer formed on the thin film by sputtering.

A plating resist film 31 is formed by patterning on the upper surface of the metal undercoating 10. In the plating resist film 31, holes 32 have been formed in portions corresponding to regions where interconnections 11 are to be formed. Electroless plating of copper is then performed by using the metal undercoating 10 as a plating current path, thereby forming interconnections 11 on the upper surface of the metal undercoating 10 in the holes 32 of the plating resist film 31. After that, the plating resist film 31 is removed.

Figure 4:
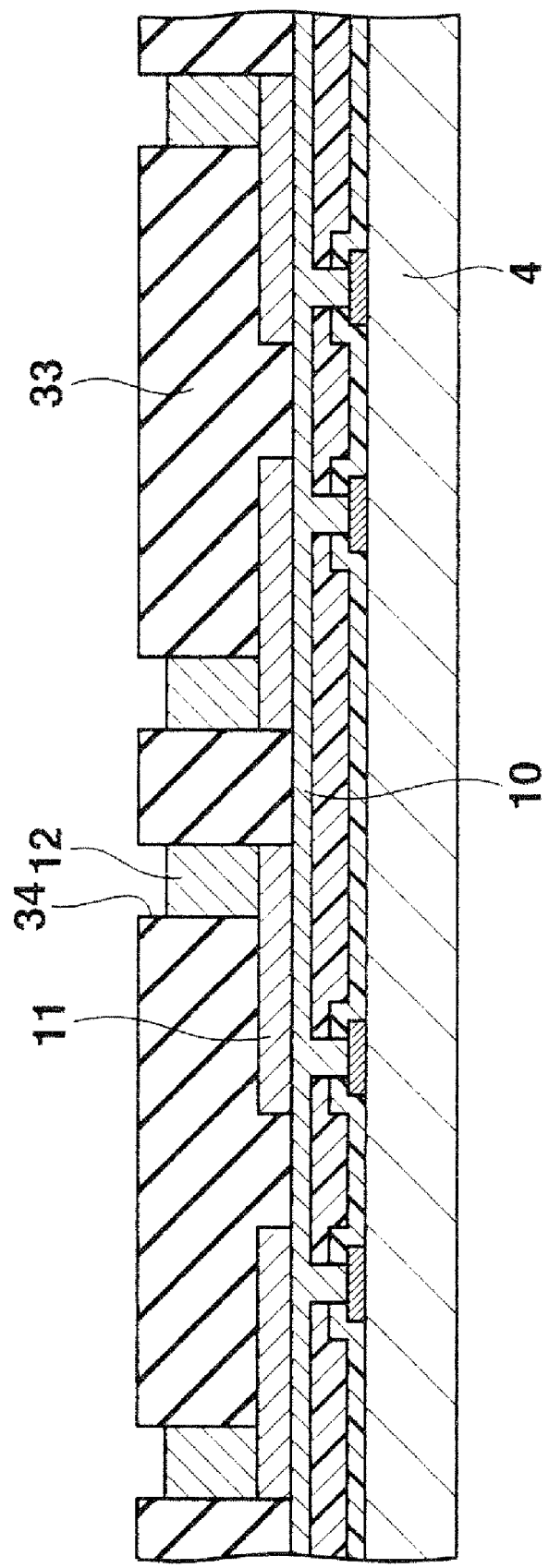
FIG. 4 is a sectional view of the assembly in a step following FIG. 3.
Figure 5:
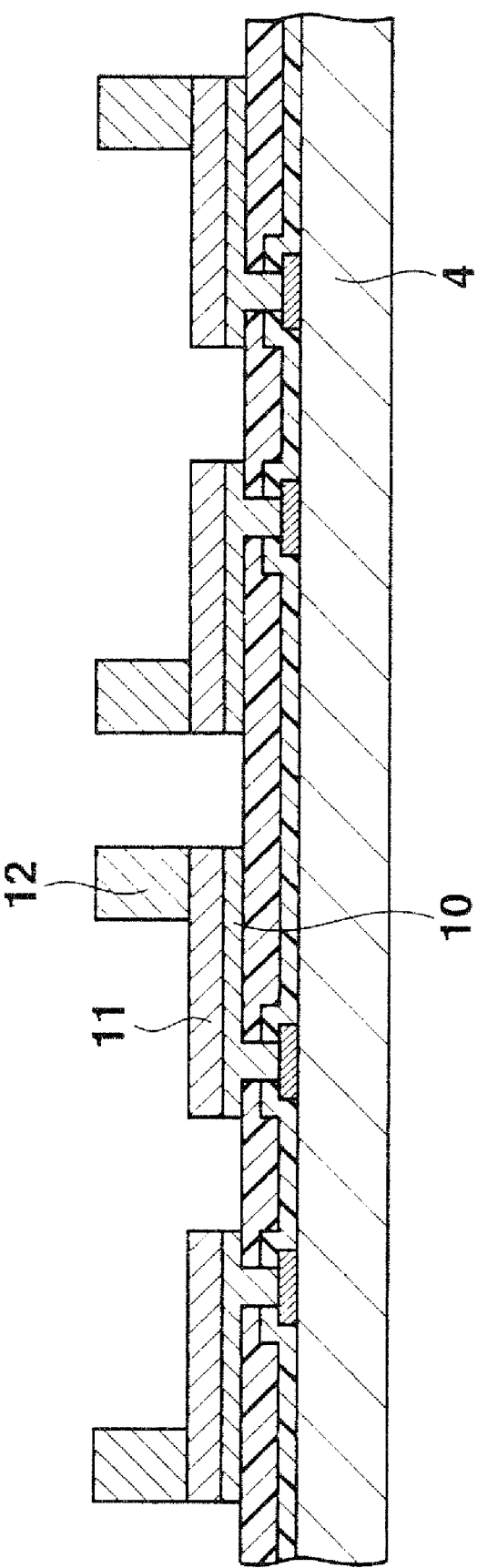
FIG. 5 is a sectional view of the assembly in a step following FIG. 4.

As shown in FIG. 4, a plating resist film 33 is formed by patterning on the upper surface of the metal undercoating 10 and the interconnections 11. In the plating resist film 33, holes 34 have been formed in portions corresponding to regions where columnar electrodes 12 are to be formed. Electroless plating of copper is then performed by using the metal undercoating 10 as a plating current path, thereby forming columnar electrodes 12 on the upper surfaces of connecting pad portions of the interconnections 11 in the holes 34 of the plating resist film 33. After that, the plating resist film 33 is removed, and unnecessary portions of the metal undercoating 10 are etched away by using the interconnections 11 as masks. Consequently, as shown in FIG. 5, the metal undercoating 10 remains only below the interconnections 11.

Figure 6:
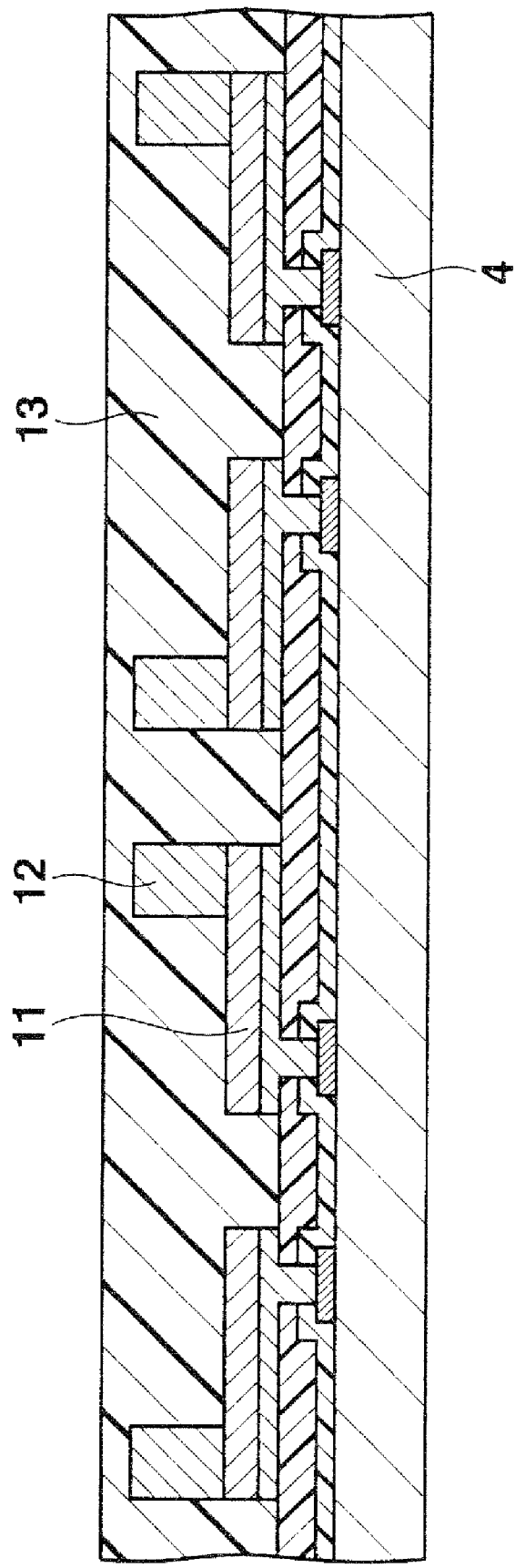
FIG. 6 is a sectional view of the assembly in a step following FIG. 5.

As shown in FIG. 6, an encapsulating film 13 made of an epoxy-based resin or polyimide-based resin is formed on the entire uppers surface of the protective film 8, the columnar electrodes 12 and interconnections 11 by, e.g., screen printing, spin coating, or die coating, such that the thickness of the encapsulating film 13 is larger than the height of the columnar electrodes 12. In this state, therefore, the upper surfaces of the columnar electrodes 12 are covered with the encapsulating film 13.

Figure 7:
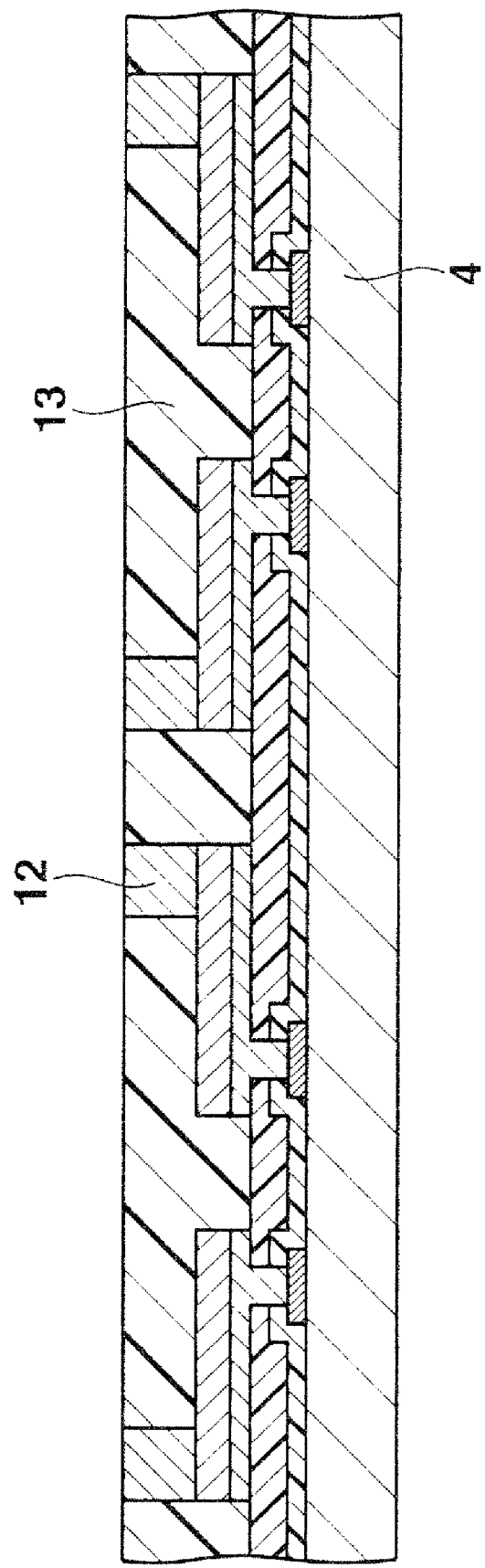
FIG. 7 is a sectional view of the assembly in a step following FIG. 6.

As shown in FIG. 7, the upper surfaces of the encapsulating film 13 and the columnar electrodes 12 are properly polished to expose the upper surfaces of the columnar electrodes 12, and planarize the upper surface of the encapsulating film 13 including those exposed upper surfaces of the columnar electrodes 12. The upper surfaces of the columnar electrodes 12 have been thus properly polished in order to make the heights of the columnar electrodes 12 uniform by eliminating variations in height of the columnar electrodes 12 formed by electroless plating.

Figure 8:
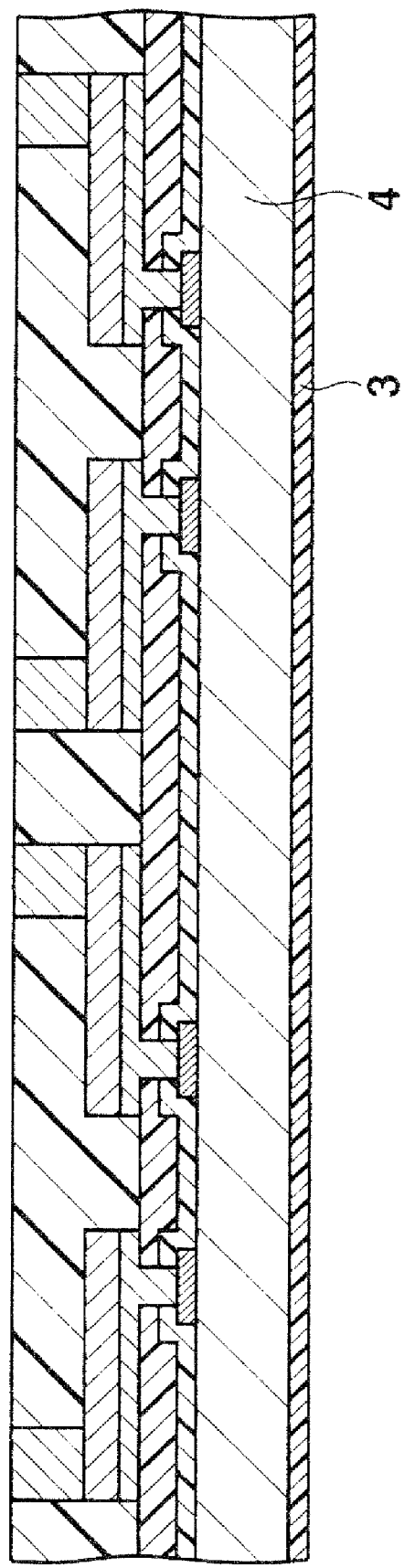
FIG. 8 is a sectional view of the assembly in a step following FIG. 7.
Figure 9:
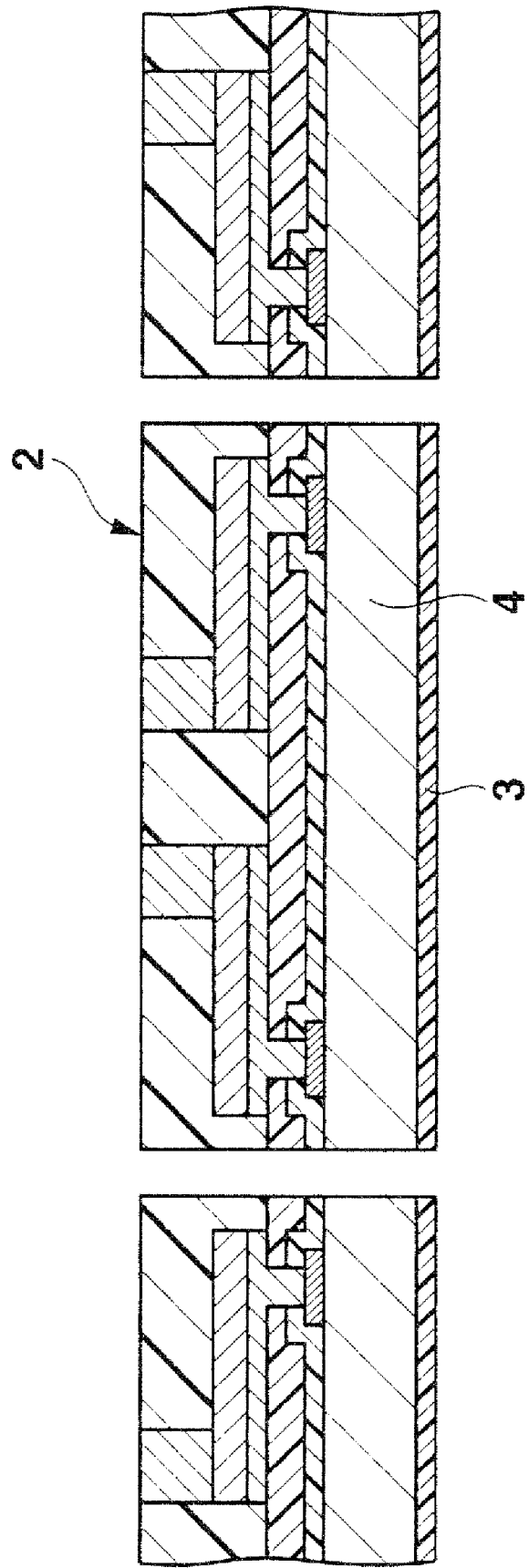
FIG. 9 is a sectional view of the assembly in a step following FIG. 8.

As shown in FIG. 8, an adhesive layer 3 is adhered to the entire lower surface of the silicon substrate 4. The adhesive layer 3 is made of a die bonding material such as an epoxy-based resin or polyimide-based resin, and adheres, in a semi-hardened state, to the silicon substrate 4 by heating and pressing. Then, the adhesive layer 3 sticking to the silicon substrate 4 is adhered to a dicing tape (not shown). After a dicing step shown in FIG. 9 is performed, the adhesive layer 3 is removed from the dicing tape. Consequently, as shown in FIG. 1, a plurality of semiconductor constituent bodies 2 each having the adhesive layer 3 on the lower surface of the silicon substrate 4 are obtained.

The semiconductor constituent body 2 thus obtained has the adhesive layer 3 on the lower surface of the silicon substrate 4. This eliminates a very cumbersome operation of forming an adhesive layer on the lower surface of the silicon substrate 4 of each semiconductor constituent body 2 after the dicing step. Note that the operation of removing the adhesive layer from the dicing tape after the dicing step is much easier than the operation of forming an adhesive layer on the lower surface of the silicon substrate 4 of each semiconductor constituent body 2 after the dicing step.

Figure 10:
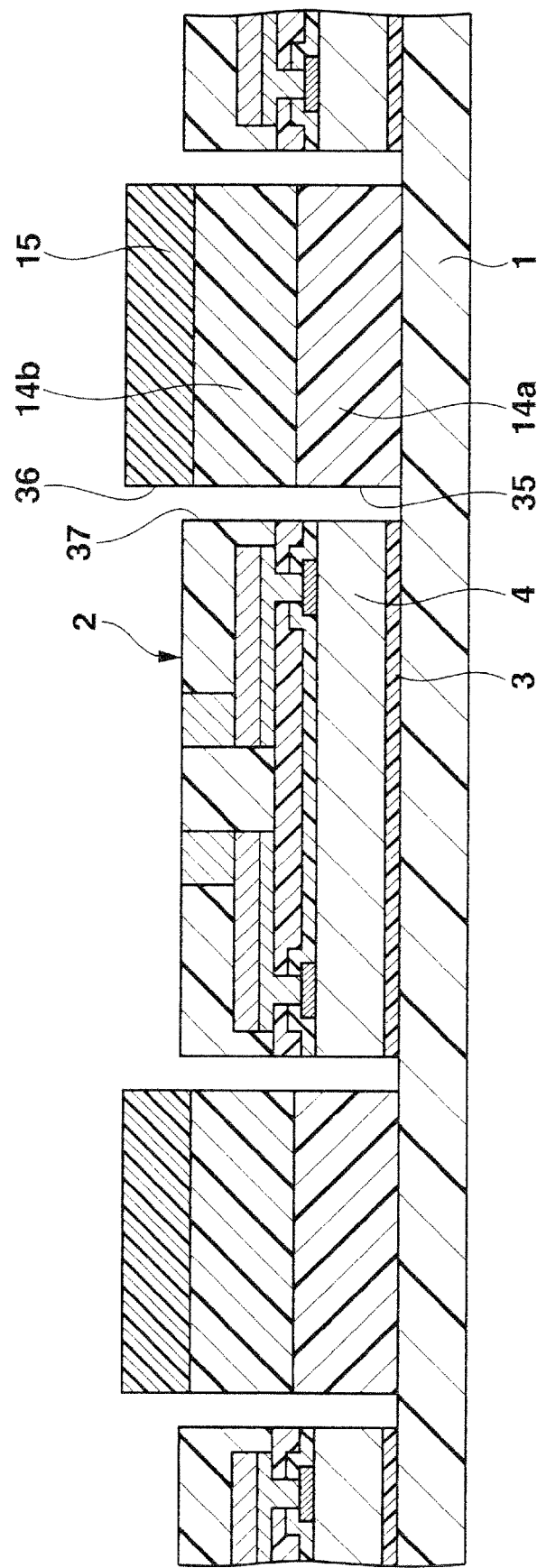
FIG. 10 is a sectional view of the assembly in a step following FIG. 9.

An example of a method of fabricating the semiconductor device shown in FIG. 1 by using the semiconductor constituent body 2 thus obtained will be described below. First, as shown in FIG. 10, a base plate 1 having an area capable of forming a plurality of completed semiconductor devices shown in FIG. 1 is prepared. The base plate 1 has, e.g., a square planar shape, although the shape is not limited to this one. The base plate 1 is formed by impregnating a substrate formed of, e.g., glass cloth with a thermosetting resin such as an epoxy-based resin, and forming the resultant substrate into a sheet by hardening the thermosetting resin.

Adhesive layers 3 each adhered to the lower surface of the silicon substrate 4 of the semiconductor constituent body 2 are adhered to a plurality of predetermined portions on the upper surface of the base plate 1. In this adhesion, the adhesive layers 3 are fully hardened by heating and pressing. After that, two lattice-like insulating layer formation sheets (insulating layer formation layers) 14a and 14b and a lattice-like hard sheet 15 are stacked, while they are positioned by pins or the like, on the upper surface of the base plate 1 around the semiconductor constituent bodies 2. Note that it is also possible to arrange the semiconductor constituent bodies 2 after the two insulating layer formation sheets 14a and 14b and the hard sheet 15 are stacked.

The lattice-like insulating layer formation sheets 14a and 14b are obtained by impregnating a substrate formed of, e.g., glass cloth with a thermosetting resin such as an epoxy-based resin, semi-hardening the thermosetting resin (in B stage) to form a sheet-like prepreg material, and forming a plurality of square holes 35 by, e.g., punching, drilling, or rooter processing. The material and thickness of the lattice-like hard sheet 15 are the same as the base plate 1. The lattice-like hard sheet 15 is obtained by forming a plurality of square holes 36 in a hardened thermosetting resin sheet by, e.g., punching, drilling, or rooter processing.

The sizes of the holes 35 and 36 are slightly larger than the size of the semiconductor constituent body 2. Accordingly, gaps 37 are formed between the insulating layer formation sheets 14a and 14b and hard sheet 15, and the semiconductor constituent bodies 2. Also, the total thickness of the insulating layer formation sheets 14a and 14b and hard sheet 15 is so set that it is larger to some extent than the thickness of the semiconductor constituent body 2, and that, as will be described later, the gaps 37 are well filled by the thermosetting resin in the insulating layer formation sheets 14a and 14b when heat and pressure are applied.

Although the insulating layer formation sheets 14a and 14b have the same thickness in this embodiment, their thicknesses may also be different. In addition, the number of the insulating layer formation sheets is two as described above, but may also be one or three or more. The point is that the hard sheet 15 made of the same material as the base plate 1, i.e., having the same thermal expansion coefficient as the base plate 1 and the same thickness as the base plate 1 need only be stacked on the upper surface of the insulating layer formation sheet.

Figure 11:
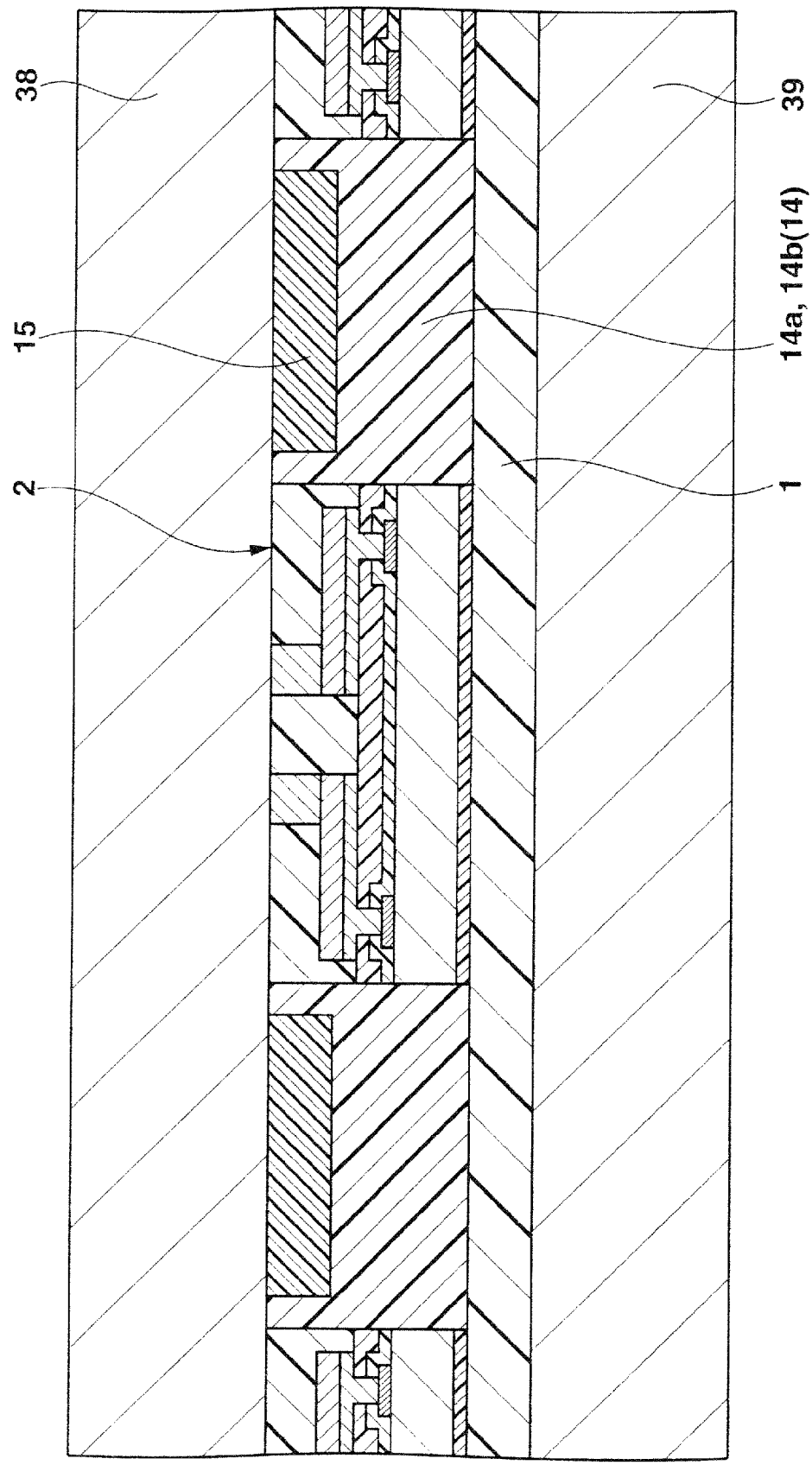
FIG. 11 is a sectional view of the assembly in a step following FIG. 10.

Then, as shown in FIG. 11, a pair of heating/pressing plates 38 and 39 are used to heat and press, from above and below, the insulating layer formation sheets 14a and 14b and hard sheet 15. As a consequence, the molten thermosetting resin in the insulating layer formation sheets 14a and 14b is pushed out and filled in the gaps 37 shown in FIG. 10. When cooling is performed after that, an insulating layer 14 is formed on the upper surface of the base plate 1 around each semiconductor constituent body 2.

On the other hand, the hard sheet 15 does not deform by heating and pressing, because the thermosetting resin in the hard sheet 15 is hardened beforehand, and is buried in predetermined regions (except for the gaps 37 shown in FIG. 10) on the upper surface of the insulating layer 14. In this state, the upper surfaces of the insulating layer 14 and hard sheet 15 are substantially leveled with the upper surfaces of the semiconductor constituent bodies 2. If necessary, the extra thermosetting resin protruding from the gaps 37 shown in FIG. 10 is removed by buff polishing or the like. Note that it is not always necessary to bury the hard sheet 15 such that its upper surface is leveled with the upper surface of the insulating layer 14 or with the upper surface of the semiconductor constituent body 2.

As shown in FIG. 10, the insulating layer formation sheets 14a and 14b stacked on the upper surface of the base plate 1 shrink when cooled and fully hardened, because they melt and harden from the semi-hardened state. Therefore, if the hard sheet 15 is not formed on the insulating layer formation sheet 14b, the base plate 1 causes large warping. In the present invention, however, the hard sheet 15 is formed on the insulating layer formation sheets 14a and 14b stacked on the upper surface of the base plate 1, and the base plate 1 and hard sheet 15 are hardened in advance. Accordingly, no shrinkage occurs even upon heating and pressing. In addition, the base plate 1 and hard sheet 15 are made of the same material, i.e., have the same thermal expansion coefficient and the same thickness, so the material arrangement in the direction of thickness in this portion is symmetrical. Therefore, the base plate 1 and hard sheet 15 suffer the same stress caused by shrinkage of the insulating layer formation sheets 14a and 14b. Consequently, the warping of the base plate 1 is eliminated or alleviated. This allows easy transfer to the subsequent steps and ensures high processing accuracy in the subsequent steps. Note that the warping of the base plate 1 can be eliminated or alleviated by the above function even when the base plate 1 and hard sheet 15 are made of the same material as the insulating layer formation sheets 14a and 14b. In this case, the material which is melted by heat from the semi-hardened state does not move into the material, i.e., the hard sheet 15 which is hardened beforehand. After cooling and fully hardening are performed, the boundary between the base plate 1 and the lower formation sheet 14a and the boundary between the hard sheet 15 and the upper formation sheet 14b clearly remain.

Furthermore, if the hard sheet 15 is not used, the total thickness of the insulating layer formation sheets 14a and 14b must be increased by an amount corresponding to the volume of the hard sheet 15. As a consequence, the upper surface of the insulating layer formation sheet 14b becomes higher to a certain degree than the upper surface of the semiconductor constituent body 2. This increases the amount of the molten resin which moves to the upper surface of the semiconductor constituent body 2. Also, if the thermosetting resin in the formation sheets 14a and 14b melts, the pressure applied to this thermosetting resin becomes nonuniform. As a consequence, the molten resin flows, and the above problem worsens.

By contrast, when the hard sheet 15 is used, the total thickness of the insulating layer formation sheets 14a and 14b can be decreased by the amount corresponding to the volume of the hard sheet 15. Also, since the pressure is evenly applied to the hard sheet 15, an even pressure can be applied to the formation sheets 14a and 14b even if the thermosetting resin in these sheets melts. Furthermore, even if the thermoset resin in the formation sheets 14a and 14b melts, the hard sheet 15 can hold this molten resin and suppress the flow of the molten resin. This makes it possible to well decrease the amount of the molten resin which moves to the upper surface of the semiconductor constituent body 2.

Figure 12:
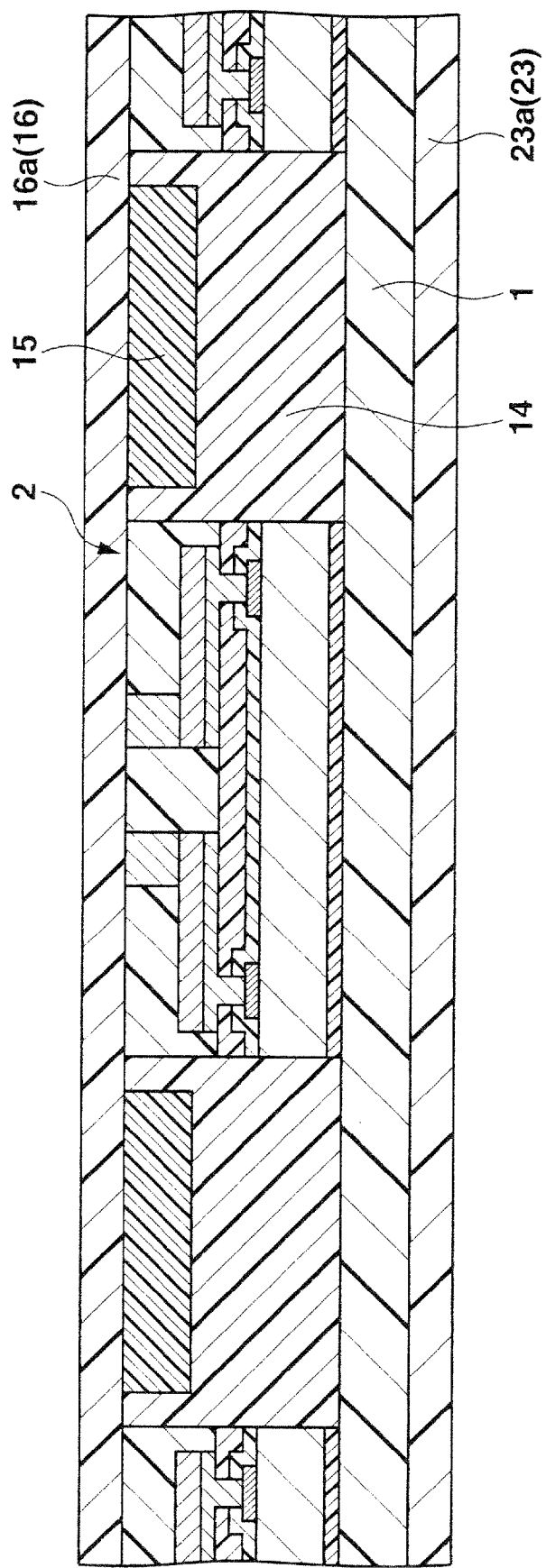
FIG. 12 is a sectional view of the assembly in a step following FIG. 11.

As shown in FIG. 12, an upper insulating film formation sheet 16a is formed on the upper surfaces of the semiconductor constituent body 2, insulating layer 14, and hard sheet 15, and a lower insulating film formation sheet 23a is formed on the lower surface of the base plate 1. The upper and lower insulating film formation sheets 16a and 23a are preferably made of a sheet-like buildup material, although they are not limited. This buildup material is obtained by mixing a silica filler in a thermosetting resin such as an epoxy-based resin, and semi-hardening the thermosetting resin.

Then, a pair of heating/pressing plates (not shown) are used to heat and press, from above and below, the upper and lower insulating film formation sheets 16a and 23a. Consequently, an upper insulating film 16 is formed on the upper surfaces of the semiconductor constituent body 2, insulating layer 14, and hard sheet 15, and a lower insulating film 23 is formed on the lower surface of the base plate 1.

In this case, the upper and lower insulating film formation sheets 16a and 23a are made of the same material and hence have the same thermal expansion coefficient. Therefore, if these two sheets have the same thickness, the material arrangement in the direction of thickness in the portion of the insulating layer 14 is symmetrical. Consequently, when heating and pressing are performed, the upper insulating film formation sheet 16a and lower insulating film formation sheet 23a are symmetrically harden and shrink in the thickness direction, so that the warping of the base plate 1 reduces. This allows easy transfer to the subsequent steps and assures high processing accuracy in the subsequent steps.

Also, the upper surface of the upper insulating film 16 is planarized because this surface pressed by the lower surface of the upper heating/pressing plate (not shown). The lower surface of the lower insulating film 23 is also planarized because this surface is pressed by the upper surface of the lower heating/pressing plate (not shown). This obviates the need for a polishing step for planarizing the upper surface of the upper insulating film 16 and the lower surface of the lower insulating film 23.

Note that as the upper and lower insulating film formation sheets 16a and 23a, it is also possible to use a prepreg material obtained by impregnating a substrate formed of, e.g., glass cloth with a thermosetting resin such as an epoxy-based resin, and semi-hardening the thermosetting resin into a sheet, or to use a sheet material made only of a thermosetting resin containing no silica filler.

Figure 13:
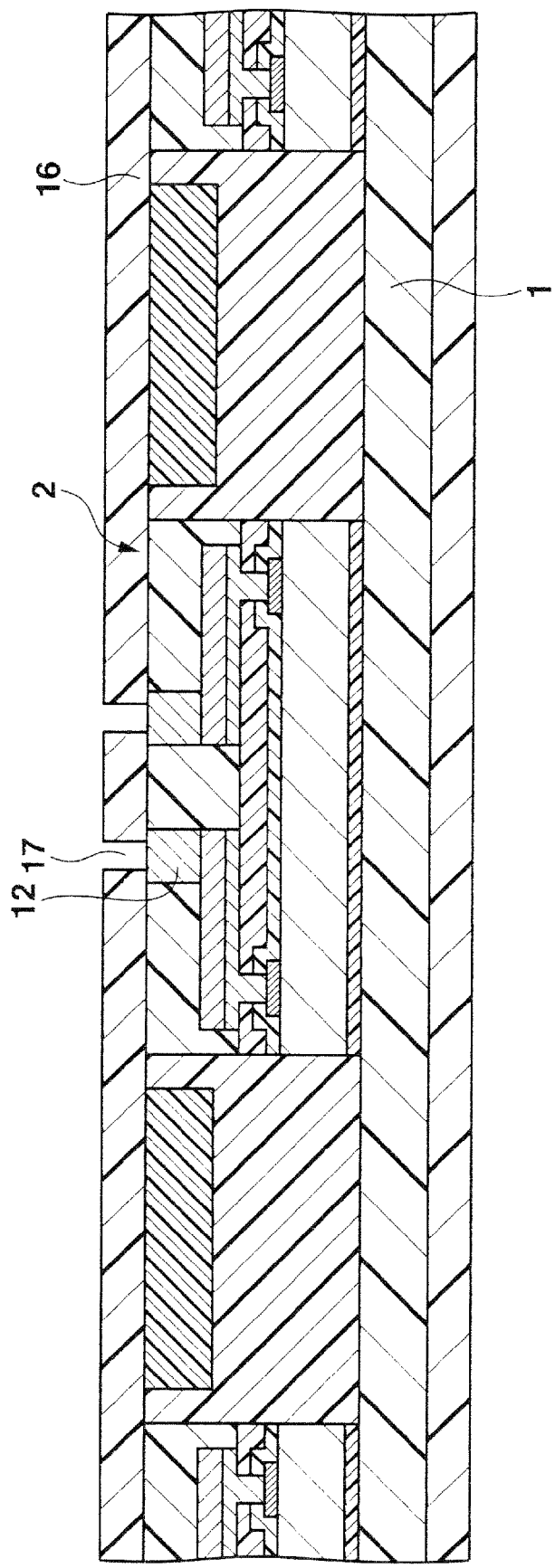
FIG. 13 is a sectional view of the assembly in a step following FIG. 12.

As shown in FIG. 13, laser processing which radiates a laser beam is used to form holes 17 in those portions of the upper insulating film 16, which correspond to the central portions of the upper surfaces of the columnar electrodes 12. Then, if necessary, epoxy smear and the like occurring in the holes 17 and the like are removed by a desmear process.

Figure 14:
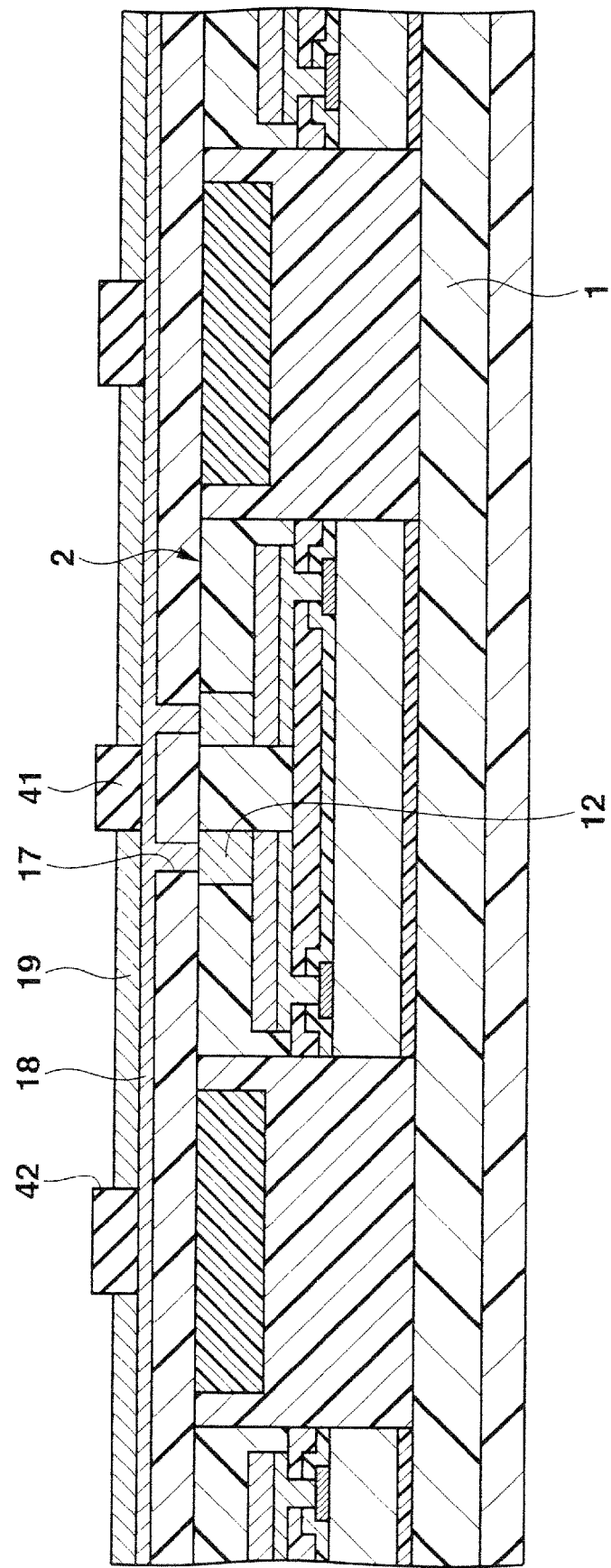
FIG. 14 is a sectional view of the assembly in a step following FIG. 13.

As shown in FIG. 14, an upper metal undercoating 18 is formed by, e.g., electroless plating of copper on the entire upper surface of the upper insulating film 16 and the upper surfaces of the columnar electrodes 12 exposed through the holes 17. A plating resist film 41 is then formed by patterning on the upper surface of the upper metal undercoating 18. In this state, holes 42 are formed in those portions of the plating resist film 41, which correspond to formation regions of upper interconnections 19.

Figure 15:
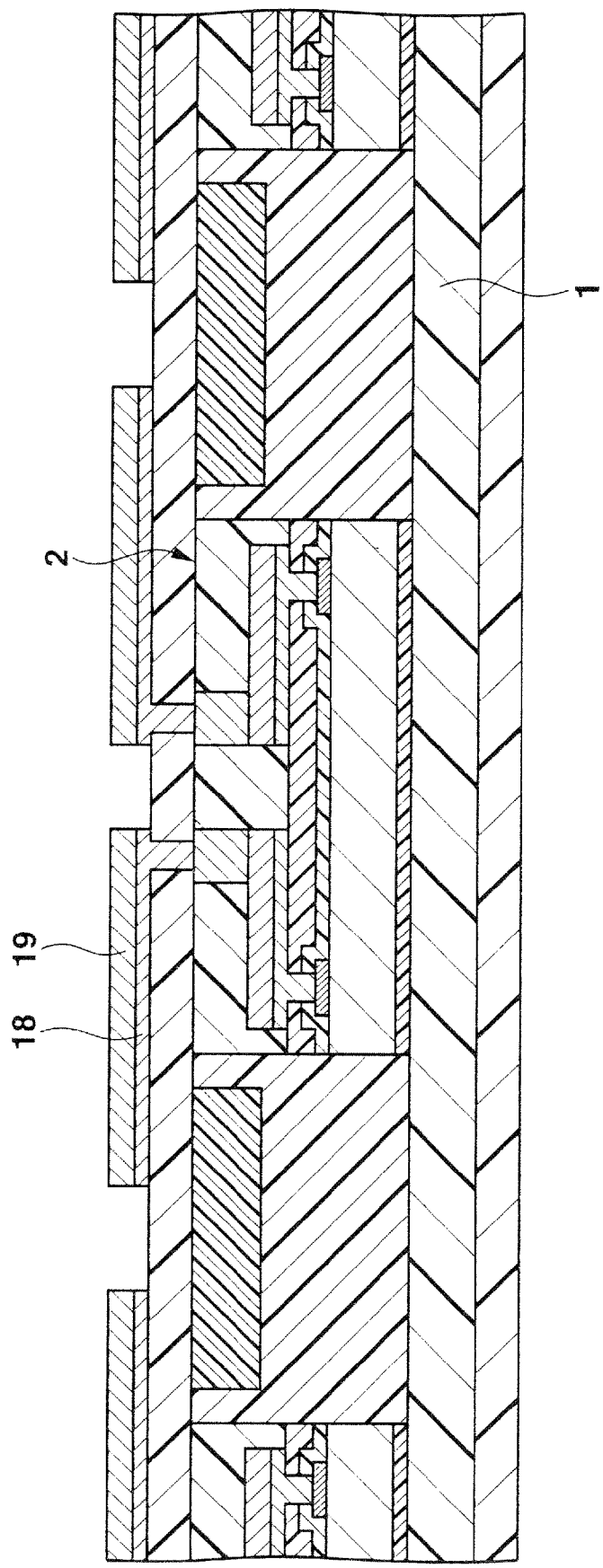
FIG. 15 is a sectional view of the assembly in a step following FIG. 14.

Electroless plating of copper is then performed by using the metal undercoating 18 as a plating current path, thereby forming upper interconnections 19 on the upper surface of the upper metal undercoating 18 in the holes 42 of the plating resist film 41. After that, the plating resist film 41 is removed, and unnecessary portions of the upper metal undercoating 18 are etched away by using the upper interconnections 19 as masks. Consequently, as shown in FIG. 15, the upper metal undercoating 18 remains only below the upper interconnections 19.

Figure 16:
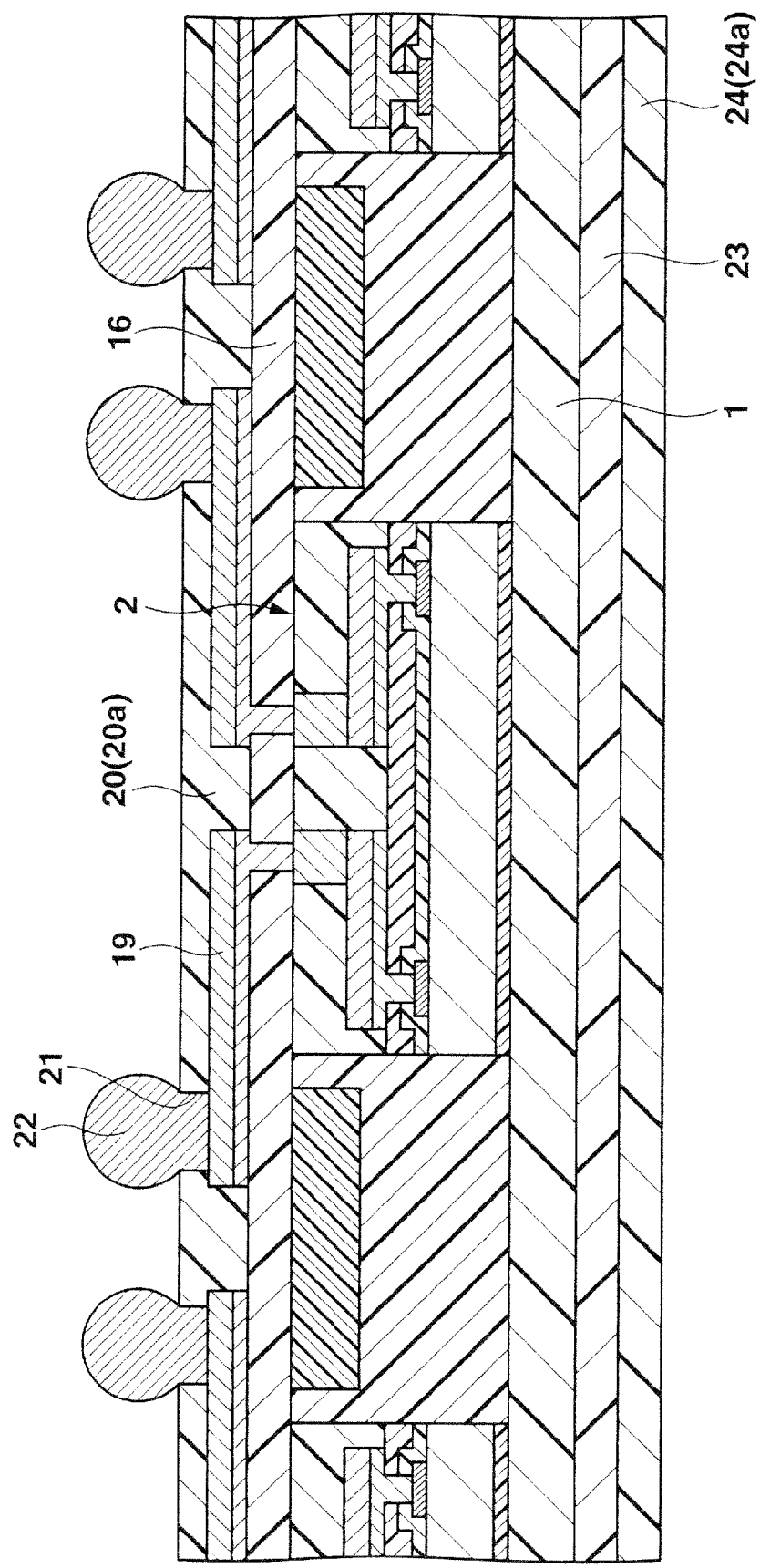
FIG. 16 is a sectional view of the assembly in a step following FIG. 15.

As shown in FIG. 16, screen printing or spin coating, for example, is used to form a solder resist film 20a on the upper surfaces of the upper insulating film 16 and the upper interconnections 19, and form a solder resist film 24a on the lower surface of the lower insulating film 23. When heating is performed after that, an uppermost insulating film 20 is formed on the upper surface of the insulating film 16 and the upper interconnections 19, and a lowermost insulating film 24 is formed on the lower surface of the lower insulating film 23.

In this structure, the solder resist films 20a and 24a for forming the uppermost insulating film 20 and lowermost insulating film 24, respectively, are made of the same material and hence have the same thermal expansion coefficient. Therefore, if the thicknesses of the solder resist films 20a and 24a are also the same, the material arrangement in the direction of thickness in the portion of the insulating layer 14 is symmetrical. As a consequence, the solder resist films 20a and 24a for forming the uppermost and lowermost insulating films 20 and 24, respectively, symmetrically harden and shrink in the thickness direction, so the warping of the base plate 1 reduces. This allows easy transfer to the subsequent steps and assures high processing accuracy in the subsequent steps.

Then, holes 21 are formed by photolithography in those portions of the uppermost insulating film 20, which correspond to connecting pad portions of the upper interconnections 19. Solder balls 22 are formed in and above the holes 21 so as to be electrically and connected to the connecting pad portions of the upper interconnections 19.

Figure 17:
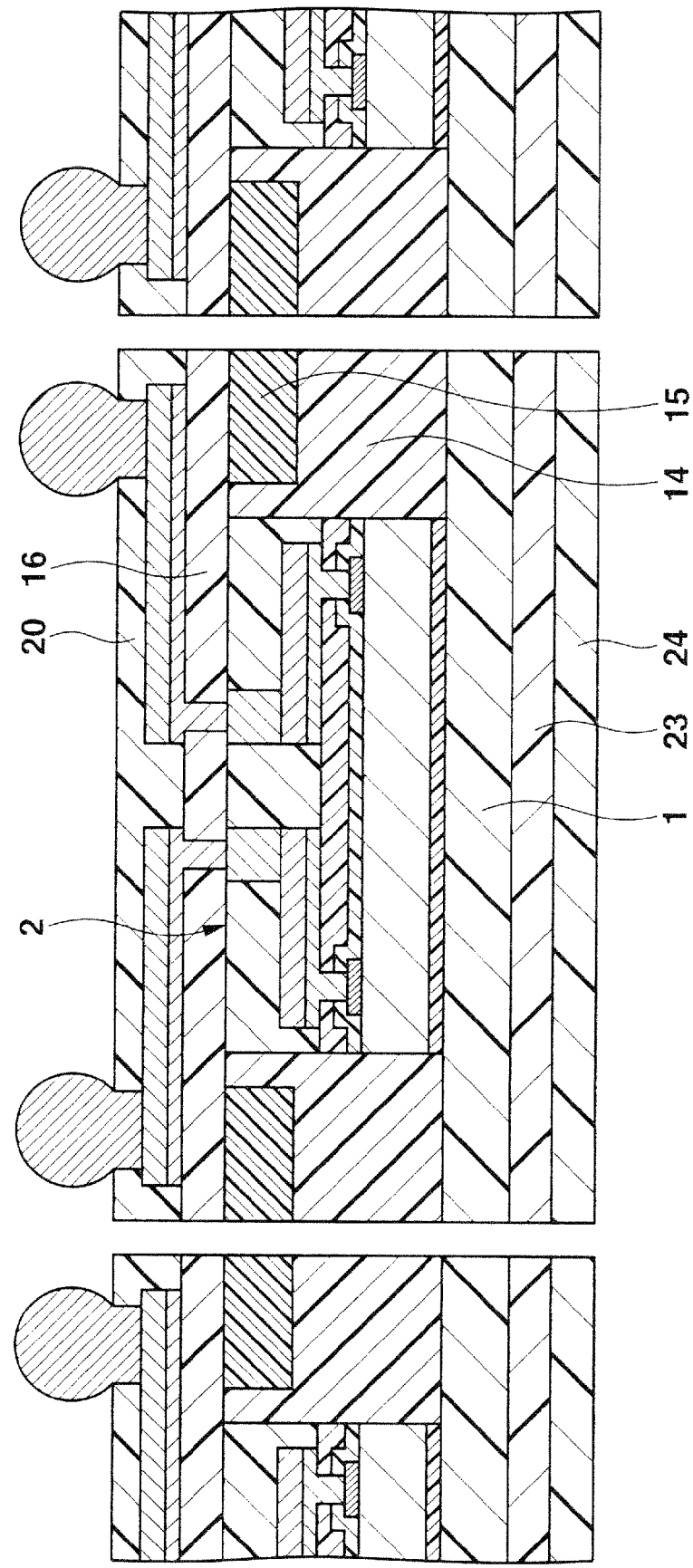
FIG. 17 is a sectional view of the assembly in a step following FIG. 16.

As shown in FIG. 17, the uppermost insulating film 20, upper insulating film 16, hard sheet 15, insulating layer 14 base plate 1, lower insulating film 23, and lowermost insulating film 24 are cut between the semiconductor constituent bodies 2 adjacent to each other. In this manner, a plurality of semiconductor devices shown in FIG. 1 are obtained.

In each of the semiconductor devices thus obtained, the hard sheet 15 made of the same material and having the same thickness as the base plate 1 and the base plate 1 are respectively formed on and under the insulating layer 14, the upper insulating film 16 and the lower insulating film 23 made of the same material and having substantially the same thickness as the upper insulating film 16 are formed on the hard sheet 15 and under the base plate 1, respectively, and the uppermost insulating film 20 and the lowermost insulating film 24 made of the same material and having substantially the same thickness as the uppermost insulating film 20 are formed on the upper insulating film 16 and under the lower insulating film 23, respectively. Therefore, the material arrangement in the direction of thickness in this portion is substantially symmetrical, and this makes the whole structure difficult to warp.

In the above fabrication method, a plurality of semiconductor constituent bodies 2 are arranged on the base plate 1 via the adhesive layer 3, the upper interconnections 19 and solder balls 22 are collectively formed with respect to the semiconductor constituent bodies 2, and then the resultant structure is cut into a plurality of semiconductor devices. Accordingly, the fabrication steps can be simplified. In addition, a plurality of semiconductor constituent bodies 2 can be transferred together with the base plate 1 from the fabrication step shown in FIG. 11. This also simplifies the fabrication steps.

Second Embodiment

Figure 18:
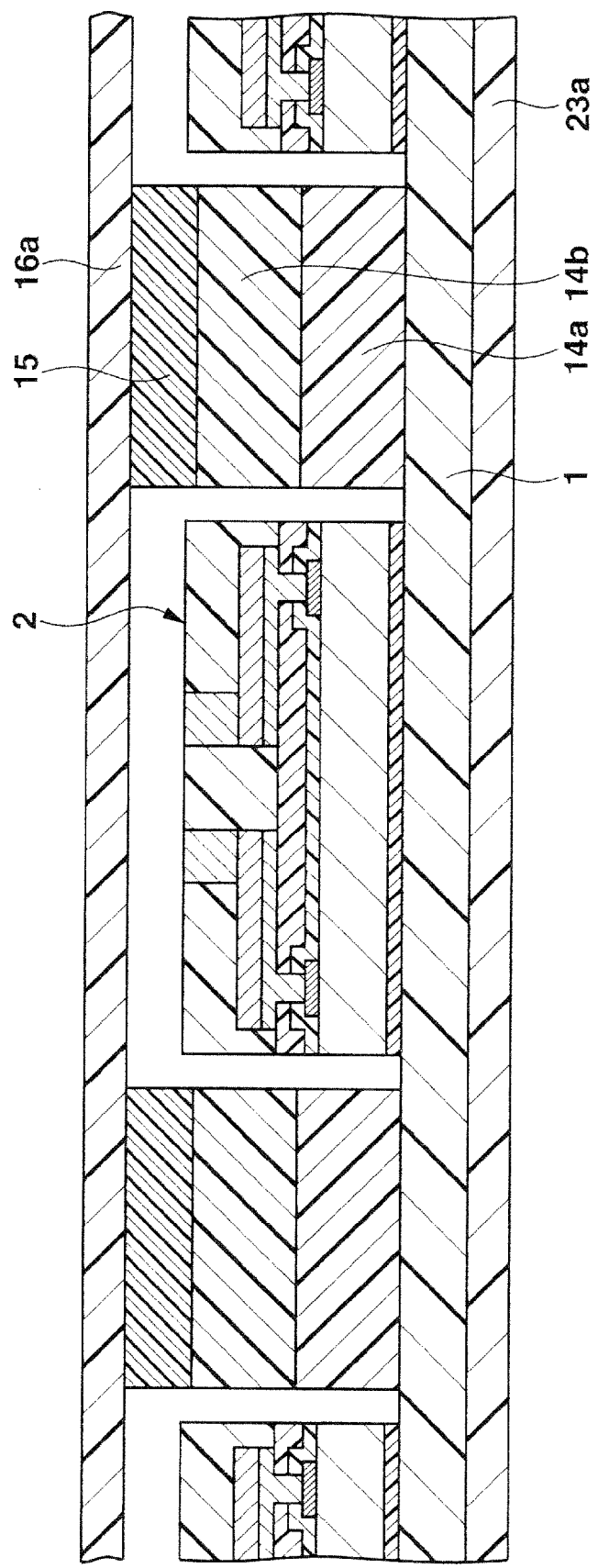
FIG. 18 is a sectional view of an assembly in a predetermined step shown to explain the second embodiment of the present invention.

FIG. 18 is a sectional view of an assembly in a predetermined step for explaining the second embodiment of the present invention. In the first embodiment, after the step shown in FIG. 10, the insulating layer 14 and hard sheet 15 are formed as shown in FIG. 11, and the upper insulating film 16 and lower insulating film 23 are formed as shown in FIG. 12.

By contrast, in the second embodiment of the present invention, after the step shown in FIG. 10, an upper insulating film formation sheet 16a is formed on the upper surface of a hard sheet 15, and a lower insulating film formation sheet 23a is formed on the lower surface of a base plate 1, as shown in FIG. 18. Then, a pair of heating/pressing plates are used to heat and press the resultant structure from above and below, as shown in, e.g., FIG. 12, thereby simultaneously forming an insulating layer 14, hard sheet 15, upper insulating film 16, and lower insulating film 23. In this embodiment, therefore, the number of heating/pressing steps can be made smaller than that in the first embodiment.

When the hard sheet 15 is used as described above, the amount of molten resin which moves to the upper surface of a semiconductor constituent body 2 can be well decreased. Accordingly, when the insulating layer 14, hard sheet 15, upper insulating film 16, and lower insulating film 23 are simultaneously formed, the amount of molten resin which moves to the upper surface of the semiconductor constituent body 2 is very small. Therefore, on the semiconductor constituent body 2, the thickness of the upper insulating film 16 including the moved molten resin can be made substantially uniform. This facilitates laser processing for forming holes 17 in the upper insulating film 16 as shown in FIG. 13. In other words, since the laser processing for forming the holes 17 in the upper insulating film 16 becomes easy, the insulating layer 14, hard sheet 15, upper insulating film 16, and lower insulating film 23 can be simultaneously formed.

Third Embodiment

Figure 19:
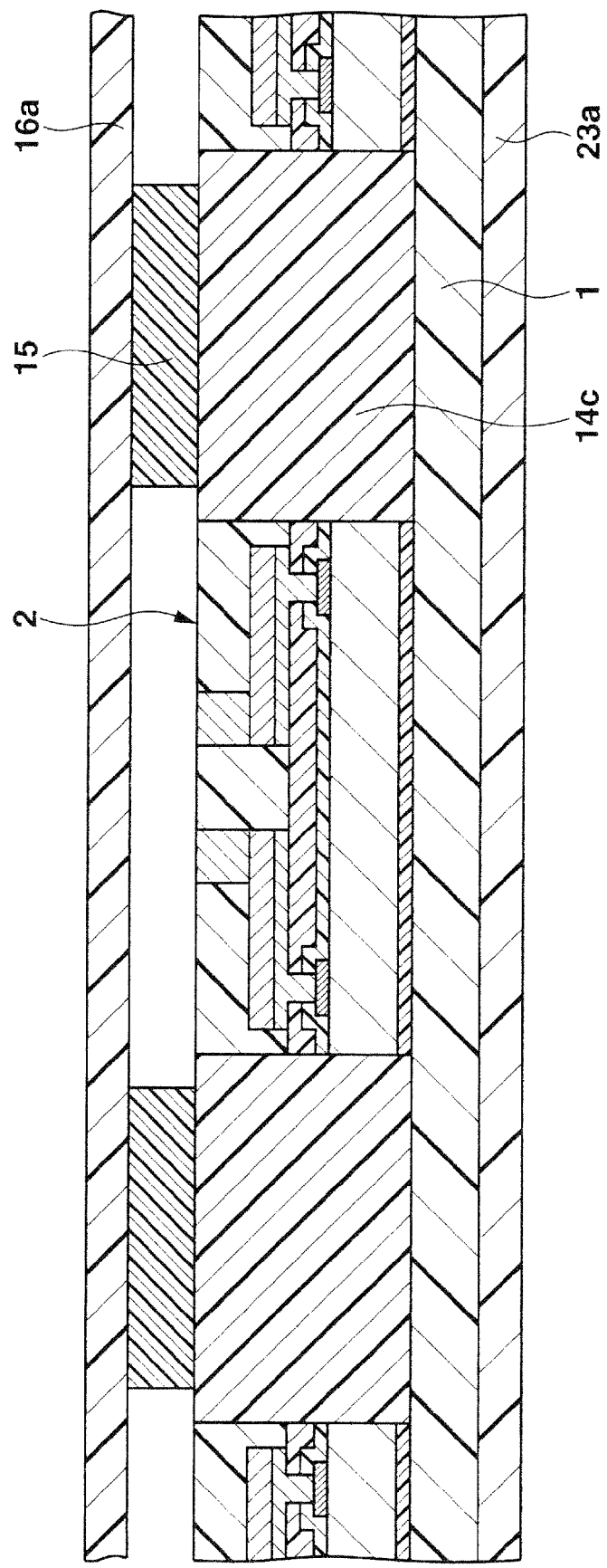
FIG. 19 is a sectional view of an assembly in a predetermined step shown to explain the third embodiment of the present invention.

FIG. 19 is a sectional view of an assembly in a predetermined step for explaining the third embodiment of the present invention. In the first embodiment, as shown in FIG. 10, the two lattice-like insulating layer formation sheets 14a and 14b and the lattice-like hard sheet 15 are stacked on the upper surface of the base plate 1 around the semiconductor constituent body 2.

By contrast, in the third embodiment of the present invention, as shown in FIG. 19, an insulating layer formation layer 14c made of a material containing at least liquid thermosetting resin is formed on the upper surface of a base plate 1 around semiconductor constituent bodies 2 by, e.g., screen printing or spin coating. Then, a lattice-like hard sheet 15 is placed on the upper surface of the insulating layer formation layer 14c.

Subsequently, an upper insulating film formation sheet 16a is placed on the upper surface of the hard sheet 15, and a lower insulating film formation sheet 23a is placed on the lower surface of the base plate 1. After that, a pair of heating/pressing plates are used to heat and press the resultant structure from above and below, as shown in, e.g., FIG. 11, thereby simultaneously forming an insulating layer 14, hard sheet 15, upper insulating film 16, and lower insulating film 23. In this embodiment, therefore, the number of heating/pressing steps can be made smaller than that in the first embodiment.

Fourth Embodiment

Figure 20:
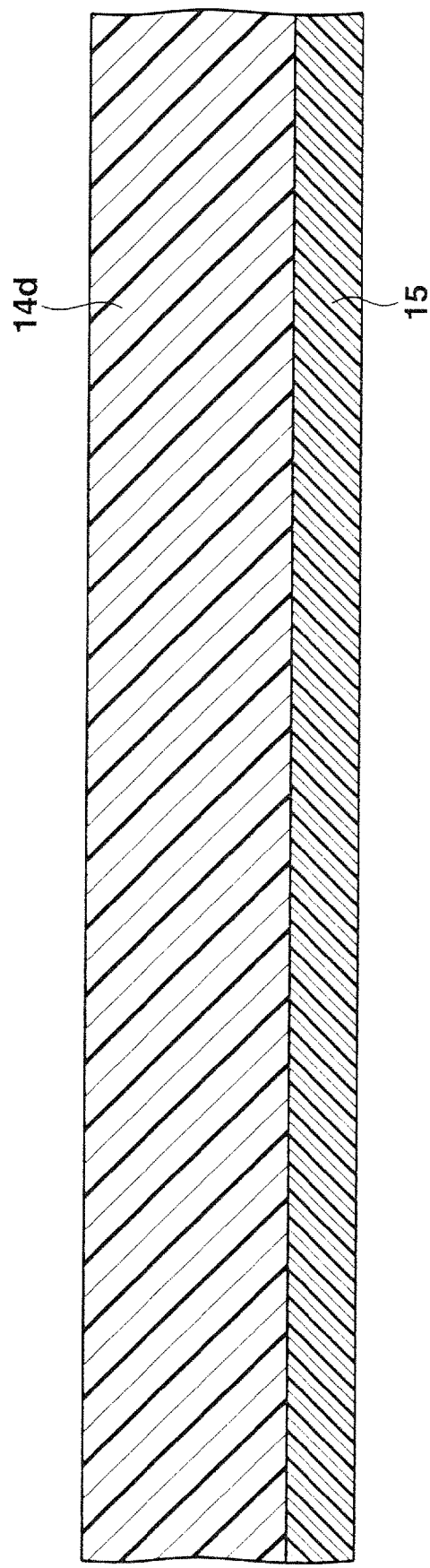
FIG. 20 is a sectional view of an assembly in a predetermined step shown to explain the fourth embodiment of the present invention.

FIG. 20 is a sectional view of an assembly in a predetermined step for explaining the fourth embodiment of the present invention. In the first embodiment, as shown in FIG. 10, the two lattice-like insulating layer formation sheets 14a and 14b and the lattice-like hard sheet 15 are stacked on the upper surface of the base plate 1 around the semiconductor constituent bodies 2.

By contrast, in the fourth embodiment of the present invention, as shown in FIG. 20, the upper surface of a hard sheet 15 is coated with a material containing at least liquid thermosetting resin by, e.g., screen printing or spin coating, and an insulating layer formation layer 14d is integrally formed by semi-hardening the thermosetting resin.

Figure 21:
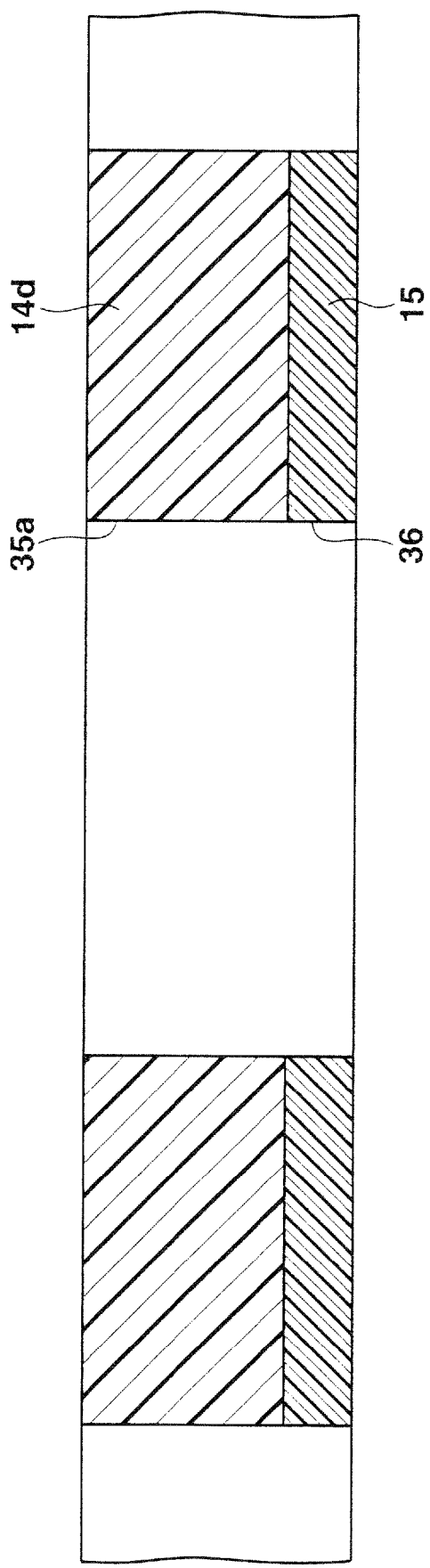
FIG. 21 is a sectional view of the assembly in a step following FIG. 20.

Then, as shown in FIG. 21, a plurality of rectangular through holes 35a and 36 are formed in the insulating layer formation layer 14d and hard sheet 15 by, e.g., punching, drilling, or rooter processing, thereby forming the insulating layer formation layer 14d and hard sheet 15 into a lattice shape. After that, as shown in FIG. 10, the structure shown in FIG. 20 is turned upside down, and placed on the upper surface of a base plate 1 around semiconductor constituent bodies 2. In this embodiment, therefore, the number of steps of arranging the insulating layer formation layer 14d and hard sheet 15 can be made smaller than that in the first embodiment.

Fifth Embodiment

Figure 22:
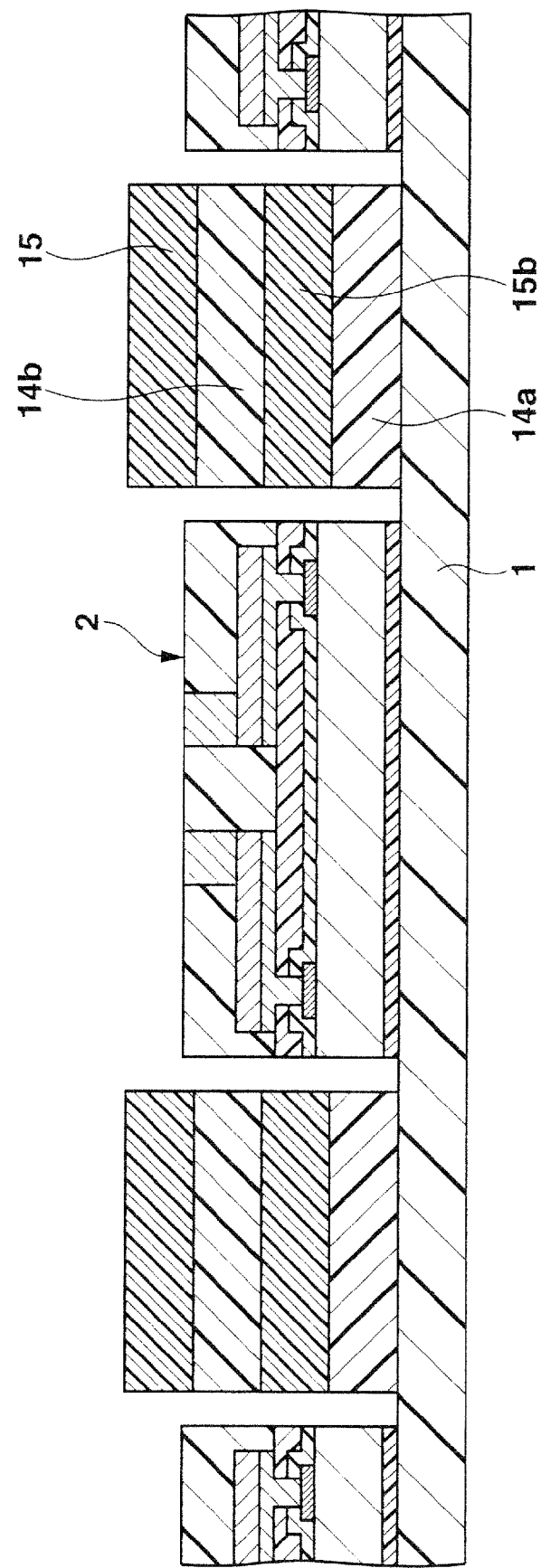
FIG. 22 is a sectional view of an assembly in a predetermined step shown to explain the fifth embodiment of the present invention.

FIG. 22 is a sectional view of an assembly in a predetermined step for explaining the fifth embodiment of the present invention. In the first embodiment, as shown in FIG. 10, one hard sheet 15 is placed on the insulating layer formation sheet 14b. By contrast, in the fifth embodiment of the present invention, as shown in FIG. 22, another hard sheet 15b is interposed between two insulating layer formation sheets 14a and 14b having the same thickness. That is, an even number of insulating layer formation sheets having the same thickness are stacked, and another hard sheet is interposed between the adjacent sheets so as to be symmetrical in the direction of thickness. As a consequence, the material arrangement in the thickness direction in this portion can be made symmetrical.

Sixth Embodiment

Figure 23:
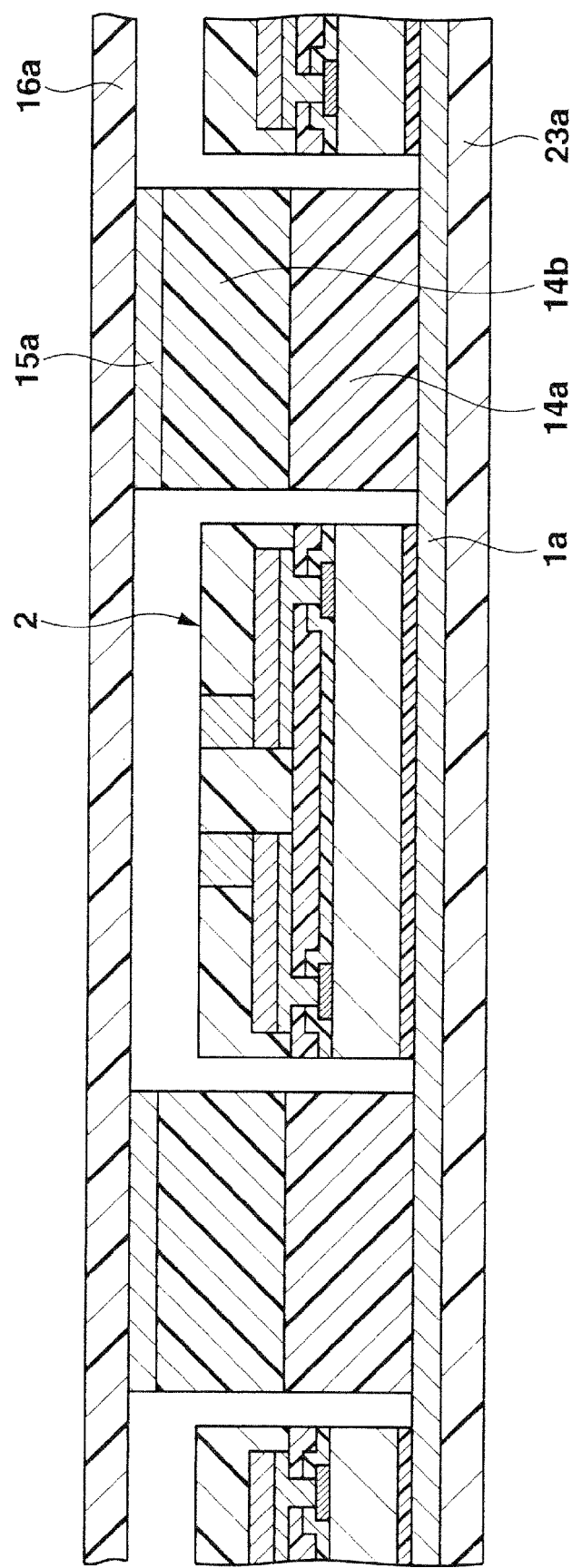
FIG. 23 is a sectional view of an assembly in a predetermined step shown to explain the sixth embodiment of the present invention.

FIG. 23 is a sectional view of an assembly in a predetermined step for explaining the sixth embodiment of the present invention. In the first embodiment, the base plate 1 is made of a material containing at least a thermosetting resin, and the hard sheet 15 is made of the same material and has the same thickness as the base plate 1. By contrast, in the sixth embodiment of the present invention, as shown in FIG. 23, a metal sheet made of, e.g., copper or stainless steel is used as a base plate 1a, and a hard sheet 15a is made of the same material and has the same thickness as the base plate 1a. That is, the base plate 1a and hard sheet 15a need not be made of a material containing at least a thermosetting resin, but can be a metal sheet made of, e.g., copper or stainless steel. It is also possible to use, e.g., a ceramic substrate or glass substrate as the base plate 1 and hard sheet 15.

In this embodiment, an upper insulating film formation sheet 16a is placed on the upper surface of the hard sheet 15a, and a lower insulating film formation sheet 23a is placed on the lower surface of the base plate 1, thereby making the material arrangement symmetrical in the direction of thickness in the portion of formation sheets 14a and 14b. Then, a pair of heating/pressing plates are used to heat and press the resultant structure from above and below, thereby simultaneously forming an insulating layer 14, hard sheet 15a, upper insulating film 16, and lower insulating film 23.

Note that in FIG. 23, it is also possible to form one of the base plate 1a and hard sheet 15a by using a metal sheet made of, e.g., copper or stainless steel, and form the other by using a material having substantially the same thermal expansion coefficient as that of the former and containing at least a thermosetting resin. For example, the thermal expansion coefficient of copper is about 16 ppm/° C., and that of stainless steel is 16 ppm/° C. On the other hand, the thermal expansion coefficient of a fully hardened glass cloth substrate epoxy resin is 10 to 20 ppm/° C. Therefore, the hard sheet 15 can be formed of a material having substantially the same thermal expansion coefficient as that of the base plate 1 and containing at least a thermosetting resin.

Seventh Embodiment

Figure 24:
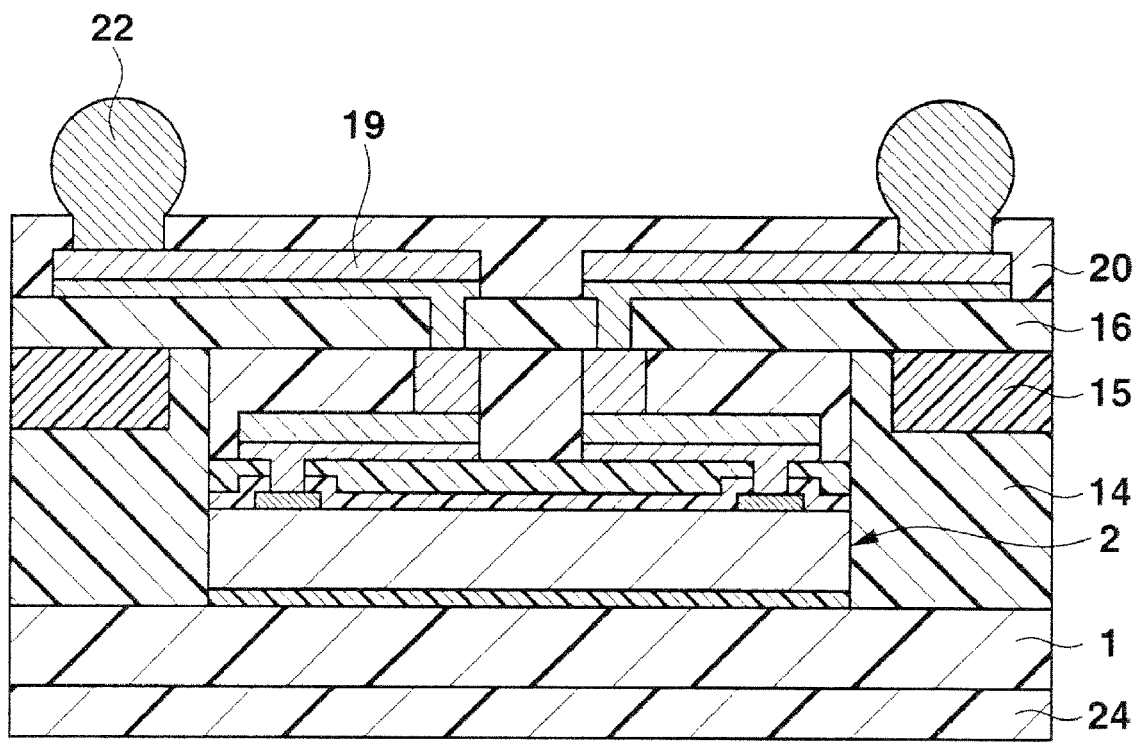
FIG. 24 is a sectional view of a semiconductor device according to the seventh embodiment of the present invention.

FIG. 24 is a sectional view of a semiconductor device according to the seventh embodiment of the present invention. This semiconductor device differs from that shown in FIG. 1 in that a lowermost insulating film 24 made of a solder resist is formed on the lower surface of a base plate 1 without forming any lower insulating film 23 made of a thermosetting resin such as an epoxy-based resin.

Referring to FIG. 11, after heating and pressing, a portion including the base plate 1, a semiconductor constituent body 2 formed on the base plate 1, an insulating layer 14 formed on the base plate 1 around the semiconductor constituent bodies 2, and a hard sheet 15 buried in the upper surface of the insulating layer 14 occupies a great part in the direction of thickness of the entire semiconductor device shown in FIG. 1, occupies most of the rigidity of the whole, and is the most effective part for the warping of the whole.

Accordingly, even when the lowermost insulating film 24 made of a solder resist is formed on the lower surface of the base plate 1 without forming any lower insulating film 23 made of a thermosetting resin such as an epoxy-based resin as in the semiconductor device shown in FIG. 24, the warping of the base plate 1 can be suppressed within the allowable range. Note that the shrinkage of a solder resist is much larger than that of a thermosetting resin such as an epoxy-based resin. Therefore, it is unpreferable to omit the lowermost insulating film 24 made of a solder resist, although the lower insulating film 23 made of a thermosetting resin such as an epoxy-based resin can be omitted.

That is, the symmetry of the material arrangement in the direction of thickness in the portion of the insulting layer 14 can slightly break, provided that the warping of the base plate 1 can be suppressed within the allowable range. Accordingly, the thickness of the hard sheet 15 can be somewhat different from that of the base plate 1, or the thickness of the lowermost insulating film 24 can be somewhat different from that of an uppermost insulating film 20. When the lower insulating film 23 is not omitted, the thickness of the lower insulating film 23 can be slightly different from that of an upper insulating film 16.

Eighth Embodiment

Figure 25:
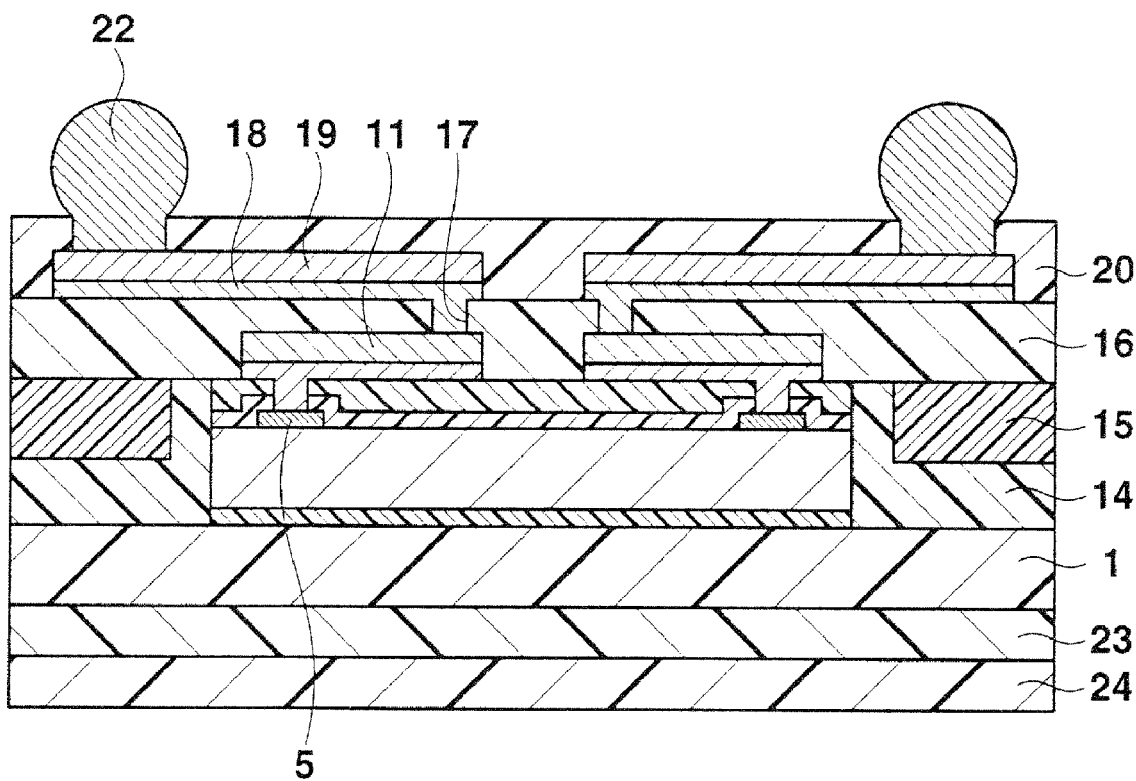
FIG. 25 is a sectional view of a semiconductor device according to the eighth embodiment of the present invention.

FIG. 25 is a sectional view of a semiconductor device according to the eighth embodiment of the present invention. A semiconductor constituent body 2 of this semiconductor device differs from the semiconductor constituent body 2 shown in FIG. 2 in that neither columnar electrodes 12 nor an encapsulating film 13 is formed, and interconnections 11 having connecting pad portions are formed as external connecting electrodes. In this structure, one end portion of each upper interconnection 19 including an upper metal undercoating 18 is connected to the connecting pad portion of the interconnection 11 through a hole 17 formed in an upper insulating film 16 and of a part of the undercoating, in the hole 17.

Ninth Embodiment

Figure 26:
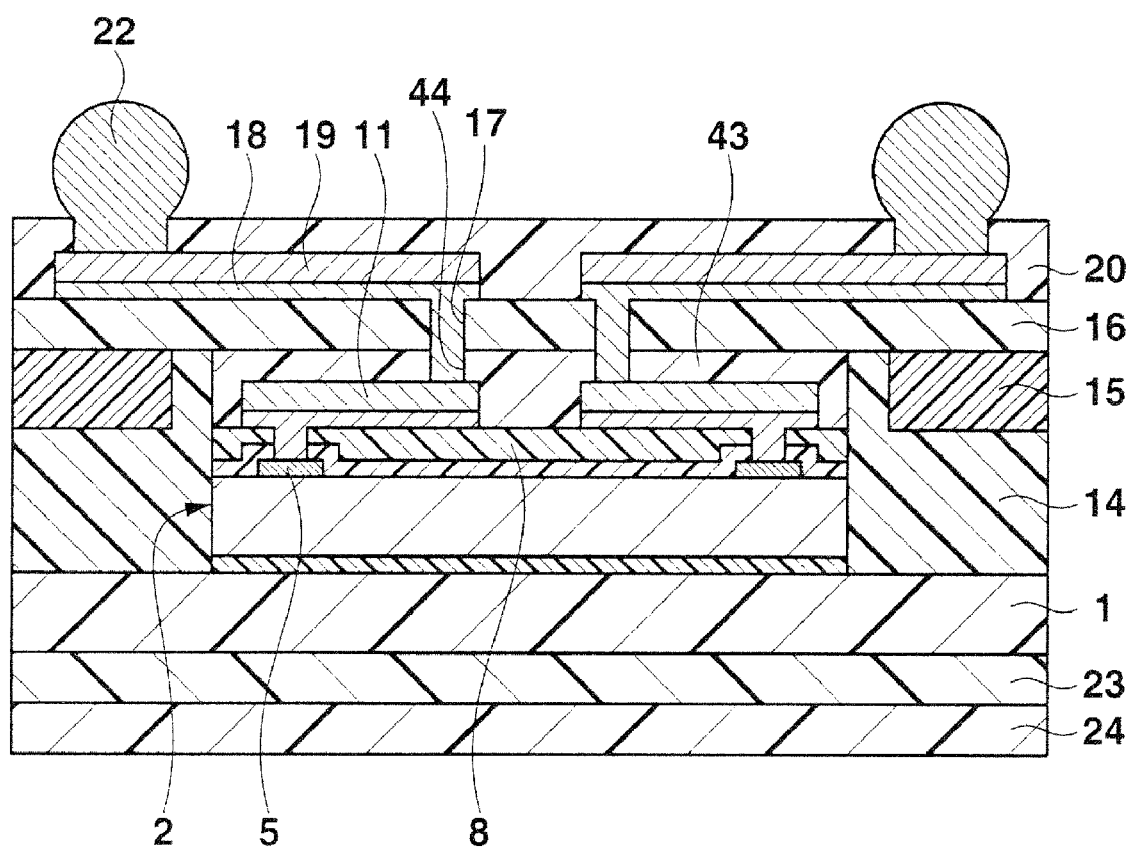
FIG. 26 is a sectional view of a semiconductor device according to the ninth embodiment of the present invention.

FIG. 26 is a sectional view of a semiconductor device according to the ninth embodiment of the present invention. A semiconductor constituent body 2 of this semiconductor device differs from the semiconductor constituent body 2 shown in FIG. 25, in that an overcoat film 43 made of, e.g., an epoxy-based resin or polyimide-based resin is formed on the upper surface of a protective film 8 including interconnections 11. In this structure, holes 44 are formed in those portions of the overcoat film 43, which correspond to connecting pad portions of the interconnections 11. One end portion of each upper interconnection 19 including an upper metal undercoating 18 is connected to the connecting pad portion of the interconnection 11 through a hole 17 formed in an upper insulating film 16 and the hole 44 in the overcoat film 43.

Note that in the semiconductor constituent body 2 shown in FIG. 26, the holes 44 need not be initially formed in the overcoat film 43. In this case, as shown in FIG. 13, the holes 17 and 44 are continuously formed in the upper insulating film 16 and overcoat film 43 by laser processing which radiates a laser beam.

10th Embodiment

Figure 27:
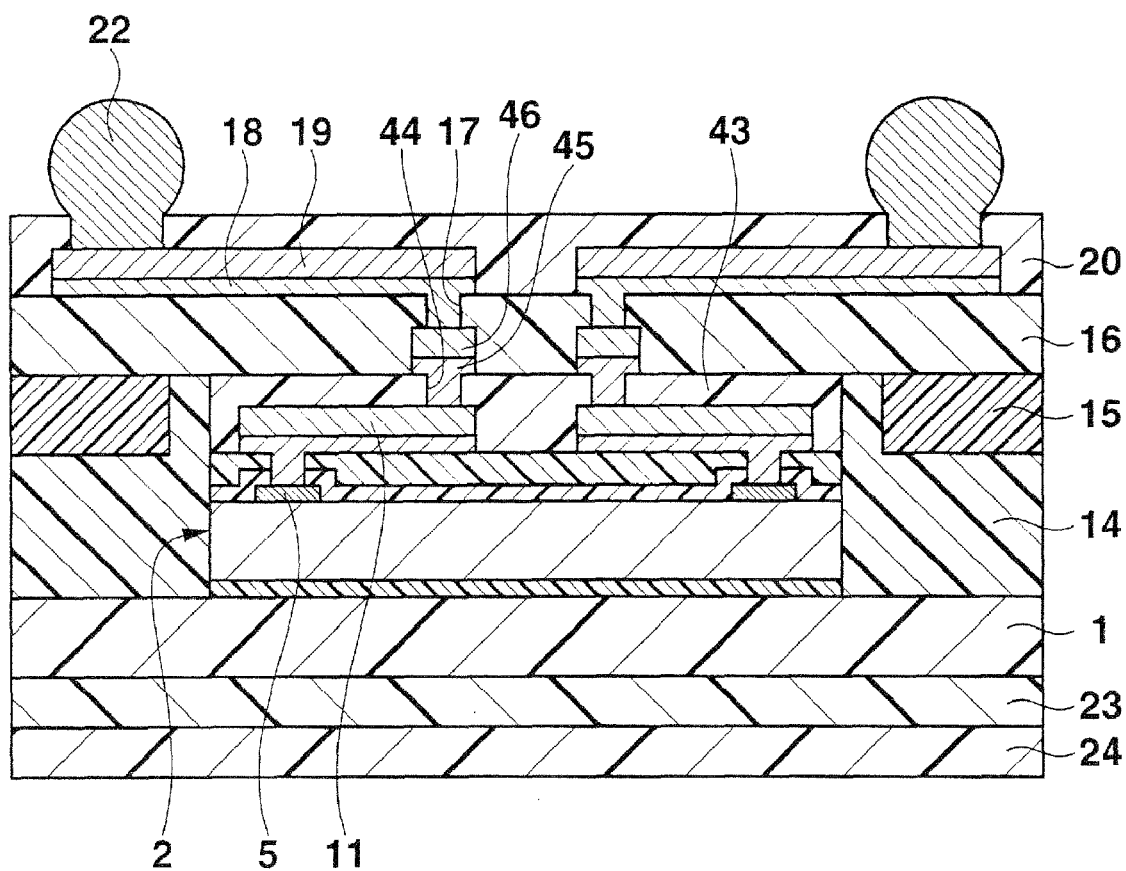
FIG. 27 is a sectional view of a semiconductor device according to the 10th embodiment of the present invention.

FIG. 27 is a sectional view of a semiconductor device according to the 10th embodiment of the present invention. A semiconductor constituent body 2 of this semiconductor device differs from the semiconductor constituent body 2 shown in FIG. 26, in that metal undercoatings 45 and upper connecting pads 46 as external connecting electrodes are formed in and around holes 44 of an overcoat film 43. Each upper connecting pad 46 including the metal undercoating 45 is connected to a connecting pad portion of an interconnection 11. Also, one end portion of each upper interconnection 19 including an upper metal undercoating 18 is connected to the upper connecting pad 46 through a hole 17 formed in an upper insulating film 16.

The semiconductor constituent bodies 2 shown in FIGS. 25 to 27 have no encapsulating film 13 shown in FIG. 1, so the upper surface of each semiconductor constituent body 2 is vulnerable to mechanical damage. To fabricate the semiconductor devices shown in FIGS. 25 to 27, therefore, the heating/pressing steps shown in FIGS. 18 and 19 are used instead of the heating/pressing step shown in FIG. 11. Since an upper insulating film formation sheet 16a reduces the pressure, mechanical damage to the upper surface of the semiconductor constituent body 2 can be decreased.

11th Embodiment

Figure 28:
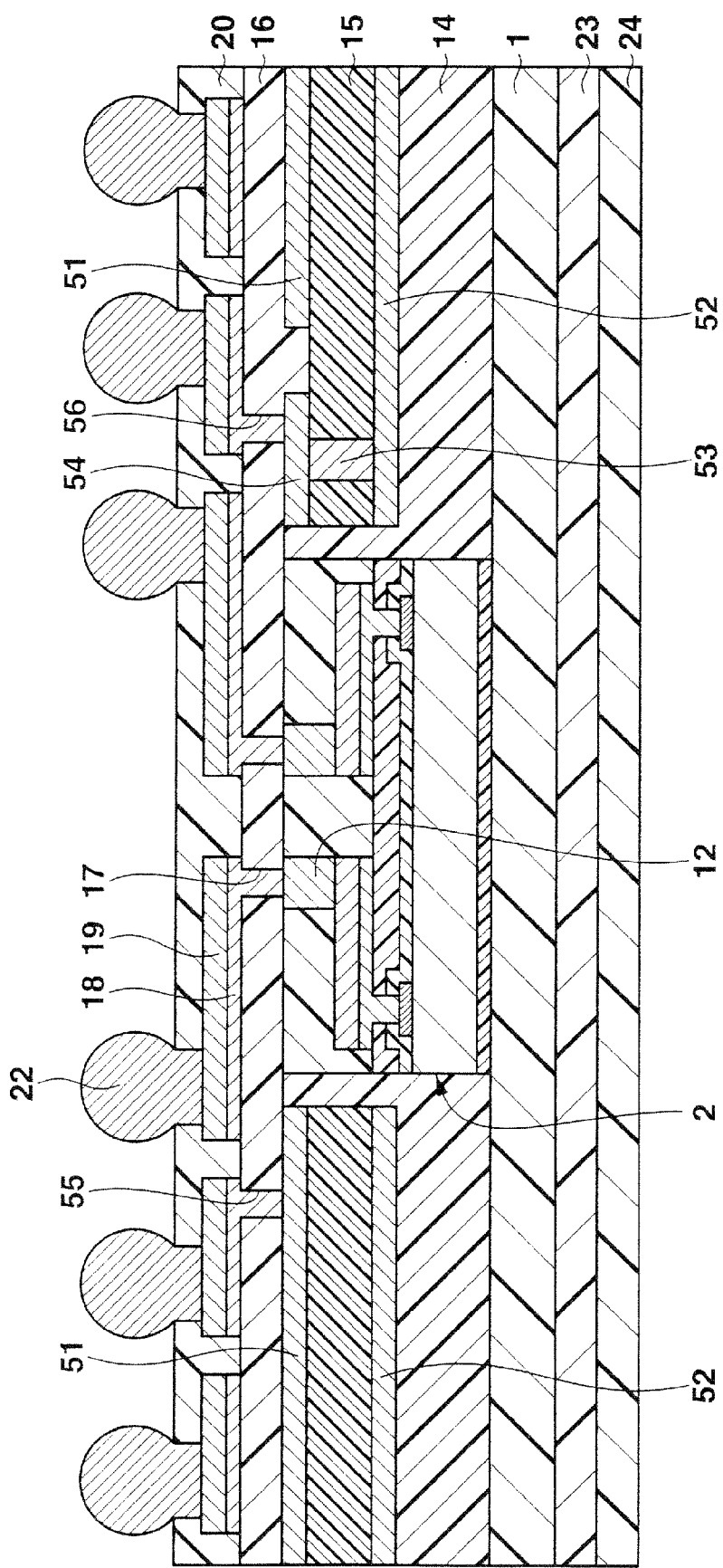
FIG. 28 is a sectional view of a semiconductor device according to the 11th embodiment of the present invention.

FIG. 28 is a sectional view of a semiconductor device according to the 11th embodiment of the present invention. A large difference of this semiconductor device from that shown in FIG. 1 is that an upper-surface interconnection 51 and lower-surface interconnection 52 each made of a metal foil such as a copper foil are formed on the upper and lower surfaces, respectively, of a hard sheet 15. The upper-surface interconnection 51 is a ground interconnection formed by a solid pattern. The lower-surface interconnection 52 is a power supply interconnection formed by a solid pattern.

The lower interconnection 52 is connected to a relay interconnection 54 formed on the hard sheet 15 through a vertical conductive portion 53 formed in the hard sheet 15. One end portion of one part of an upper interconnection 19 including a metal undercoating 18 is connected to the upper-surface interconnection 51 through a hole 55 in an upper insulating film 16. One end portion of the other part of the upper interconnection 19 including the metal undercoating 18 is connected to the relay interconnection 54 through a hole 56 in the upper insulating film 16.

Note that in FIG. 28, the upper interconnection 51 is a ground interconnection formed by a solid pattern, so the interconnection 51 forming this ground interconnection and the upper interconnection 19 on the upper insulating film 16 may also form a microstrip line structure. A ground interconnection or power supply interconnection formed by a solid pattern may also be formed only on the upper surface of the hard sheet 15 so as to be connected to the upper interconnection 19. Furthermore, a normal interconnection pattern may also be formed only on the upper surface of the hard sheet 15 so as to be connected to the upper interconnection 19.

12th Embodiment

Figure 29:
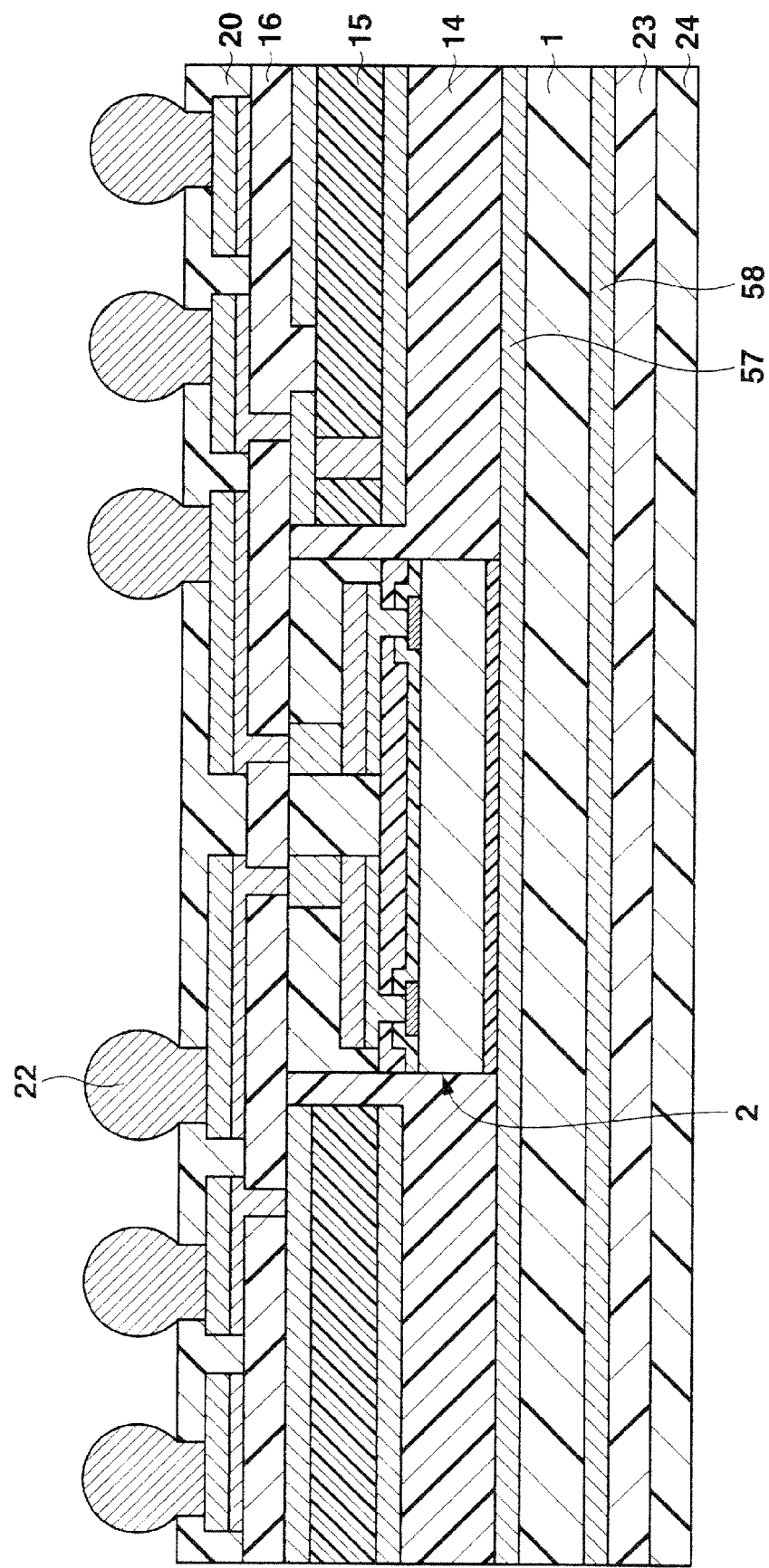
FIG. 29 is a sectional view of a semiconductor device according to the 12th embodiment of the present invention.

FIG. 29 is a sectional view of a semiconductor device according to the 12th embodiment of the present invention. A large difference of this semiconductor device from that shown in FIG. 1 is that solid heat-radiating layers 57 and 58 each made of a metal foil such as a copper foil are formed on the upper and lower surfaces, respectively, of a base plate 1. Note that it is also possible to form a heat-radiating layer only on one surface of the base plate 1.

13th Embodiment

Figure 30:
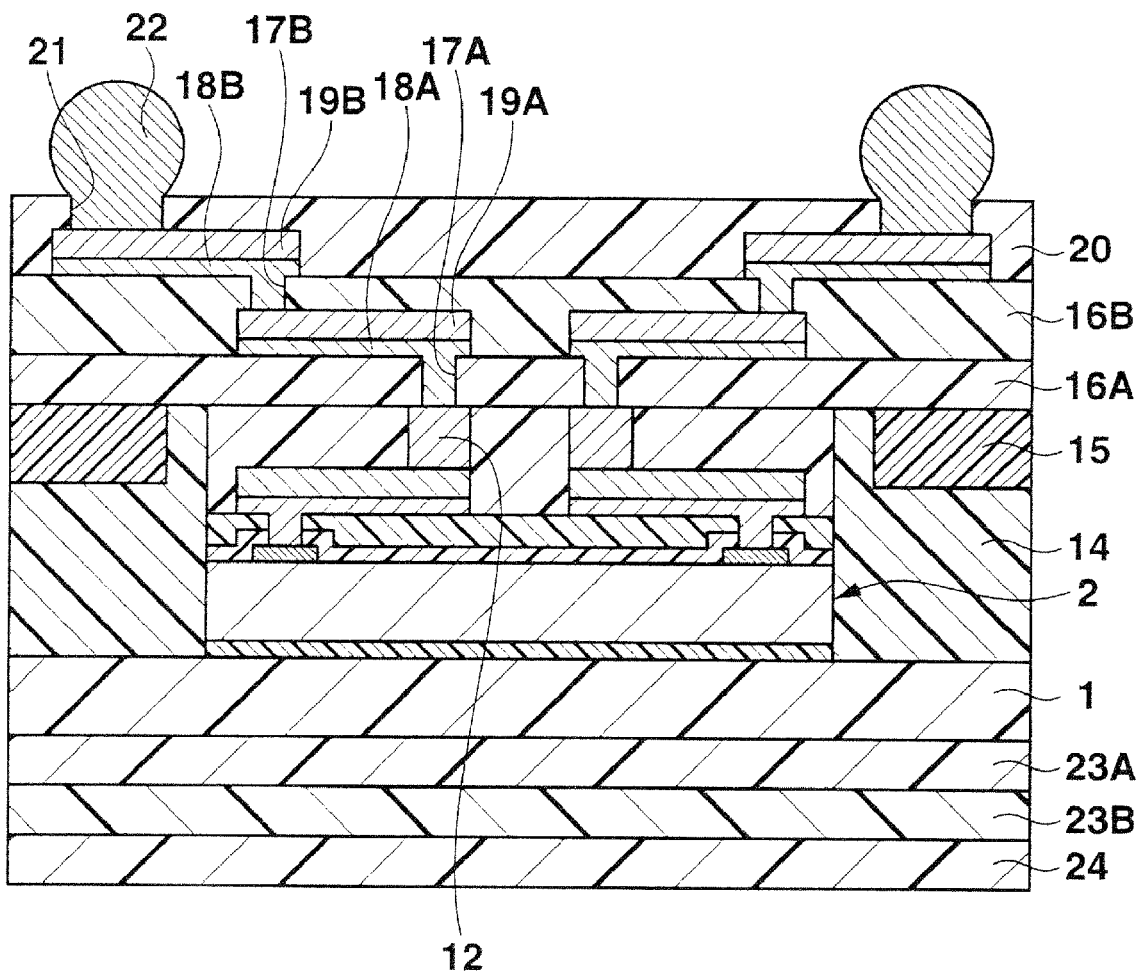
FIG. 30 is a sectional view of a semiconductor device according to the 13th embodiment of the present invention.

FIG. 30 is a sectional view of a semiconductor device according to the 13th embodiment of the present invention. A large difference of this semiconductor device from that shown in FIG. 1 is that an upper insulating film, upper interconnection, and lower insulating film are two-layered films. That is, on the upper surface of a first upper insulating film 16A including a first upper interconnection 19A, a second upper insulating film 16B made of the same material as the first upper insulating film 16A is formed. On the upper surface of the second upper insulating film 16B, a second upper interconnection 19B including a metal undercoating 18B is formed.

One end portion of the first upper interconnection 19A including a metal undercoating 18A is connected to the upper surface of a columnar electrode 12 through a hole 17A formed in the first upper insulating film 16A. One end portion of the second upper interconnection 19B including the metal undercoating 18B is connected to a connecting pad portion of the first upper interconnection 19A through a hole 17B formed in the second upper insulating film 16B. A solder ball 22 is connected to a connecting pad portion of the second upper interconnection 19B through a hole 21 formed in an uppermost insulating film 20.

To reduce the warping of a base plate 1 during and after the fabrication steps, a first lower insulating film 23A made of the same material and having the same thickness as the first upper insulating film 16A is formed on the lower surface of the base plate 1, a second lower insulating film 23B made of the same material and having the same thickness as the second upper insulating film 16B is formed on the lower surface of the first under insulating film 23A, and a lowermost insulating film 24 made of the same material and having the same thickness as the uppermost insulating film 20 is formed on the lower surface of the second lower insulating film 23B. Note that each of the upper insulating film, upper interconnection, and lower insulating film may also include three or more layers.

Another Embodiment

In the first embodiment described earlier, as shown in FIG. 17, the semiconductor wafer is cut between the semiconductor constituent bodies 2 adjacent to each other. However, two or more semiconductor constituent bodies 2 may also be separated together as one set to obtain a multichip-module semiconductor device. In this semiconductor device, the types of a plurality of semiconductor constituent bodies 2 forming one set can be either the same or different.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device fabrication method comprising:
separately arranging, on an upper surface of a base plate, a plurality of semiconductor constituent bodies each having a semiconductor substrate and a plurality of external connecting electrodes formed on the semiconductor substrate;
forming, on the upper surface of the base plate around each semiconductor constituent body, an insulating layer formation layer made of a material containing a resin selected from the group consisting of a semi-hardened thermosetting resin and liquid thermosetting resin, and placing, on an upper surface of the insulating layer formation layer, a hard sheet having a hole corresponding to each semiconductor constituent body;
performing heating and pressing to form an insulating layer on the base plate around each semiconductor constituent body by fully hardening the semi-hardened thermosetting resin or liquid thermosetting resin in the insulating layer formation layer, and to bury at least a portion of the hard sheet in the insulating layer;
forming an interconnection to be connected to the external connecting electrodes of each semiconductor constituent body; and
obtaining a plurality of semiconductor devices by cutting the hard sheet, insulating layer, and base plate between the semiconductor constituent bodies.

2. A semiconductor device fabrication method according to claim 1, wherein the insulating layer formation layer is made of an insulating layer formation sheet which is semi-hardened and has a hole corresponding to each semiconductor constituent body.

3. A semiconductor device fabrication method according to claim 2, wherein forming the insulating layer formation layer further comprises forming another insulating layer formation sheet on the hard sheet, and placing another hard sheet on the another insulating layer formation sheet.

4. A semiconductor device fabrication method according to claim 1, wherein forming the insulating layer formation layer comprises coating a material containing the liquid thermosetting resin on the base plate around each semiconductor constituent body.

5. A semiconductor device fabrication method according to claim 1, wherein the insulating layer formation layer is semi-hardened and integrally formed on a lower surface of the hard sheet.

6. A semiconductor device fabrication method according to claim 1, wherein the hard sheet is made of substantially the same material as the base plate.

7. A semiconductor device fabrication method according to claim 1, wherein the hard sheet has substantially the same thickness as the base plate.

8. A semiconductor device fabrication method according to claim 1, wherein the base plate and hard sheet are made of a material containing at least a thermosetting resin, and are hardened before performing the heating and pressing.

9. A semiconductor device fabrication method according to claim 1, wherein the base plate and hard sheet are formed of a substrate including an inorganic material.

10. A semiconductor device fabrication method according to claim 1, wherein the hard sheet is made of substantially the same material as the insulating layer.

11. A semiconductor device fabrication method according to claim 1, wherein the hard sheet is made of a material having substantially the same thermal expansion coefficient as the base plate.

12. A semiconductor device fabrication method according to claim 1, wherein one of the base plate and hard sheet is made of a metal sheet, and the other is made of a material containing at least a thermosetting resin.

13. A semiconductor device fabrication method according to claim 12, wherein the metal sheet is made of a material selected from the group comprising copper and stainless steel.

14. A semiconductor device fabrication method according to claim 1, wherein the interconnection is an upper interconnection, and the semiconductor device fabrication method further comprises forming an upper insulating film on the hard sheet, and forming the upper interconnection on the upper insulating film.

15. A semiconductor device fabrication method according to claim 14, wherein forming the upper insulating film on the hard sheet comprises forming a semi-hardened upper insulating film on the hard sheet, and fully hardening the semi-hardened upper insulating film by heating and pressing.

16. A semiconductor device fabrication method according to claim 15, wherein the insulating layer and upper insulating film are simultaneously fully hardened by heating and pressing.

17. A semiconductor device fabrication method according to claim 15, wherein at the same time the upper insulating film is fully hardened by heating and pressing, a lower insulating film made of substantially the same material as the upper insulating film is formed on a lower surface of the base plate.

18. A semiconductor device fabrication method according to claim 17, wherein the insulating layer, upper insulating film, and lower insulating film are simultaneously fully hardened by heating and pressing.

19. A semiconductor device fabrication method according to claim 14, further comprising forming an uppermost insulating film which covers a portion except for a connecting pad portion of the upper interconnection, and forming, on a lowermost surface of the base plate, a lowermost insulating film made of substantially the same material as the uppermost insulating film.

20. A semiconductor device fabrication method according to claim 19, wherein the uppermost insulating film and lowermost insulating film are formed of a solder resist.

21. A semiconductor device fabrication method according to claim 19, further comprising forming a solder ball on the connecting pad portion of upper interconnection.

* * * * *